(12) United States Patent
Rostoker et al.

(10) Patent No.: US 6,470,482 B1
(45) Date of Patent: *Oct. 22, 2002

(54) METHOD AND SYSTEM FOR CREATING, DERIVING AND VALIDATING STRUCTURAL DESCRIPTION OF ELECTRONIC SYSTEM FROM HIGHER LEVEL, BEHAVIOR-ORIENTED DESCRIPTION, INCLUDING INTERACTIVE SCHEMATIC DESIGN AND SIMULATION

(75) Inventors: Michael D. Rostoker, San Jose, CA (US); Carlos Dangelo, Los Gatos, CA (US); Daniel R. Watkins, Los Altos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/689,204

(22) Filed: Aug. 5, 1996

Related U.S. Application Data

(63) Continuation of application No. 08/077,294, filed on Jun. 14, 1993, now Pat. No. 5,544,067, which is a continuation-in-part of application No. 08/054,053, filed on Apr. 26, 1993, now abandoned, which is a continuation of application No. 07/507,201, filed on Apr. 6, 1990, now Pat. No. 5,222,030, said application No. 08/689,204, is a continuation-in-part of application No. 07/917,801, filed on Jul. 20, 1992, now Pat. No. 5,220,512, which is a continuation of application No. 07/512,129, filed on Apr. 19, 1990, now abandoned.

(51) Int. Cl.⁷ .............................................. G06F 17/50
(52) U.S. Cl. .................................... 716/6; 716/5; 716/2
(58) Field of Search ...................... 716/6, 5, 2

(56) References Cited

U.S. PATENT DOCUMENTS

T940,008 I4 11/1975 Oden .......................... 444/1
T940,020 I4 11/1975 Brechling et al. ............. 444/1
4,353,117 A 10/1982 Spellman ...................... 364/300
4,587,625 A * 5/1986 Marino et al. ............... 364/578
4,635,208 A * 1/1987 Coleby et al. ............... 364/491
4,675,832 A * 6/1987 Robinson et al. ........... 364/488

(List continued on next page.)

FOREIGN PATENT DOCUMENTS

| EP | 0 319 232 A2 | 6/1989 | ..................... 15/40 |
| EP | 0 463 301 A2 | 1/1992 | ..................... 15/60 |
| EP | 0 473 960 A2 | 3/1992 | ..................... 15/40 |

OTHER PUBLICATIONS

J.M. Kleinhans et al.; Gordian: VLSI Placement by Quadratic Programming and Slicing Optimization; Mar. 1991 IEEE, vol. 10, No. 3, pp. 356–365.

(List continued on next page.)

*Primary Examiner*—Vincent N. Trans

(57) ABSTRACT

A system for interactive design, synthesis and simulation of an electronic system allowing a user to design a system either by specification of a behavioral model in a high level language such as VHDL or by graphical entry. The user can view full or partial simulation and design results simultaneously, on a single display window. The synthesis process uses a systematic technique to map and enforce consistency of the semantics imbedded in the intent of the original, high-level descriptions. The design activity is generally a series of transformations operating upon various levels of design representations. At each level, the design can be simulated and reviewed in schematic diagram form. The simulation results can be displayed immediately adjacent to signal lines on the diagram to which they correspond. In one embodiment, design rule violations are processed by an expert system to suggest possible corrections or alterations to the design which will eliminate the design rule violations. Schematic diagram and simulation displays showing those portions of the electronic system and simulated signal patterns which are related to the design rule violations are used to help the user identify and appropriately correct problems in the design.

23 Claims, 21 Drawing Sheets

U.S. PATENT DOCUMENTS

| | | | |
|---|---|---|---|
| 4,697,241 A | * 9/1987 | Lavi | 364/488 |
| 4,703,435 A | * 10/1987 | Darringer et al. | 364/489 |
| 4,789,944 A | * 12/1988 | Wada et al. | 364/488 |
| 4,805,113 A | * 2/1989 | Ishii et al. | 364/491 |
| 4,813,013 A | * 3/1989 | Dunn | 364/488 |
| 4,827,427 A | * 5/1989 | Hyduke | 364/488 |
| 4,831,543 A | * 5/1989 | Mastellone | 364/489 |
| 4,833,619 A | 5/1989 | Shimizu et al. | 364/489 |
| 4,890,238 A | * 12/1989 | Klein et al. | 364/491 |
| 4,908,772 A | * 3/1990 | Chi | 364/491 |
| 4,918,614 A | * 4/1990 | Modarres et al. | 364/490 |
| 4,922,432 A | 5/1990 | Kobayashi et al. | 364/490 |
| 4,965,741 A | * 10/1990 | Winchell et al. | 364/488 |
| 4,967,367 A | * 10/1990 | Piednoir | 364/489 |
| 4,970,664 A | * 11/1990 | Kaiser et al. | 364/488 |
| 5,005,136 A | * 4/1991 | Van Berkel et al. | 364/490 |
| 5,034,899 A | * 7/1991 | Schult | 364/488 |
| 5,084,824 A | 1/1992 | Lam et al. | 364/490 |
| 5,111,413 A | * 5/1992 | Lazansky et al. | 364/488 |
| 5,164,908 A | * 11/1992 | Igarashi | 364/491 |
| 5,164,911 A | 11/1992 | Juran et al. | 364/578 |
| 5,220,512 A | 6/1993 | Watkins et al. | 364/489 |
| 5,222,030 A | 6/1993 | Dangelo et al. | 364/489 |
| 5,544,066 A | * 8/1996 | Rostoker et al. | 364/489 |

OTHER PUBLICATIONS

W. Sun et al.; A Loosely Coupled Parallel Algorithm for Standard Cell Placement; 1994 ACM; pp. 137–144.

H. Onodera et al.; A Block Placement Procedure Using a Force Model; 1989 Scripta Technica, Inc.; pp. 87–96.

K. Ueda et al., Champ: Chip Floor Plan for Hierarchical VLSI Layout Design; Jan. 1985 IEEE, vol. CAD–4, No. 1.

N.R. Quinn, Jr., et al,; A Force Directed Component Placement Procedure for Printed Circuit Boards; 1979 IEEE; pp. 377–388.

C. Sechen et al.; An Improved Simulated Annealing Alorithm for Row–Based Placement; 1987 IEEE; pp. 478–481.

C.M. Fiduccia et al.; A Linear–Time Heuristic for Improving Network Partitions; 1982 IEEE; pp. 175–181.

"Methods Used in an Automatic Logic Design Generator (ALERT)", IEEE Trans. On Computers, vol. C–18, No. 7, Jul. 1969, pp. 593–614.*

"Partioning and Placement Technique for CMOS Gate Arrays" by Odawara et al, IEEE Trans. On Computer–Aided Design, vol. CAD–6, No. 3, May 1987, pp. 355–363.*

"Theory and Concepts of Circuit Layout" by Hu et al., IEEE 1985, pp. 3–18.*

"Tango–Schematic Capture Software," PERX Catalog, pp. 18 & 19.

"Methods Used in an Automatic Logic Design Generator (ALERT)", by Friedman et al., IEEE Transactions on Computers, vol. C18, No. 7, Jul. 1969, pp. 593–614.

"Quality of Designs from an Automatic Logic Generator (ALERT)," Friedman et al., IEEE Design Automation Conference, 1970, pp. 71–80.

"Design Automation," by Russo, Computer, May/Jun. 1972, pp. 19–22.

"Computer Aided Design," by Lynn, Computer, May/Jun. 1972, pp. 36–45.

"Recent Developments in Design Automation," By Breuer, Computer, May/Jun. 1972, pp. 23–35.

"LINDA: A Local Interactive Design Aid for Computer–Aided General–Purpose Artwork Production," by Briggs, GEC Journal of Science & Technology, vol. 43, No. 2, 1976.

"An Engineering System for Designer, Manager and Manufacturer," by Smith et al., Telesis, vol. 4, No. 9, Dec. 1976, pp. 268–273.

"Computer Graphics in Power Plant Design," by Strong et al., IEEE Power Engineering Society, Jul. 1978.

"An Automated System to Support Design Analysis," by Willis, 12th Annual Asilomar Conference on Circuits, Systems & Computers, IEEE, Nov. 1978, pp. 646–650.

"Computer–Aided Partioning of Behavioral Hardware Descriptions," by McFarland, 20th Design Automation Conference, IEEE, 1983, pp. 472–478.

"Definite Clause Translation Grammars," by Abramson, University of British Columbia, IEEE, 1984, pp. 233–240.

"Verify: A Program for Providing Correctness of Digital Hardware Designs," by Barrow, Artificial Intelligence 24,1984, pp. 437–483.

"Switch–Level Delay Models for Digital MOS VLSI," by Ousterhout, IEEE 21st Design Automation Conference, 1984, pp. 542–548.

"Automated Generation of Digital System Schematic Diagrams," by Arya et al., 22nd Design Automation Conference, IEEE, 1985, pp. 388–395.

"Using Bottom–Up Design Techniques in the Synthesis of Digital Hardware form Abstract Behavioral Descriptions," by McFarland, 23rd Design Automation Conference, IEEE, 1986, pp. 474–480.

"Partitioning Before Logic Synthesis," by Camposano et al., IBM Thomas J. Watson Research Center, IEEE, 1987, pp. 324–326.

"Partitioning and Placement Technique for CMOS Gate Arrays," by Odawara et al., IEEE Transactions on Computer–Aided Design, vol. CAD–6, No. 3, May 1987, pp. 355–363.

"Partioning a Design in Structural Synthesis," by Camposano et al., IBM Watson Research Center, IEEE, 1987, pp. 564–566.

"The System Architect's Workbench," by Thomas et al., 1988 DAC Draft Submission, Nov. 1987.

"Formal Verification of Digital Circuits Using Hybrid Stimulation," by Srinivas et al., IEEE Circuits and Devices Magazine, Jan. 1988, pp. 19–26.

"Tektronix Design Automation Products," 1988, pp. 83–90.

"Formal Verification of the Sobel Image Processing Chip," by Narendran et al., 25th ACM/IEEE Design Automation Conference, 1988, pp. 211–217.

"Area–Time Model for Synthesis of Non–Pipelined Designs," by Jain et al., CH2657–5 1988 IEEE, pp. 48–51.

"CAD for System Design: Is It Practical?", IEEE Design & Test of Computers, Apr. 1989, pp. 46–55.

"Architectural Partitioning for System Level Design," by Lagnese et al., 26th ACM/IEEE Design Automation Conference, 1988, pp. 62–67.

"Here's an Easy Way to Test ASICs," by MacLeod, Electronics, May 1989, pp. 116–117.

"Experience with the ADAM Synthesis System," by Jain et al., 26TH ACM/IEEE Design Automation Conference, 1989, pp. 56–61.

"Chippe: A System for Constraint Driven Behavioral Synthesis," by Brewer et al., IEEE Transactions on Computer–Aided Design, vol. 9, No. 7, Jul. 1990, pp. 681–695.

"BAD: Behavioral Area–Delay Predictor," by Kucukcakar et al., CEng Technical Report 90–31, Nov. 1990.

"An Efficient Heuristic Procedure for Partitioning Graphs," by B.W. Kernighan et al., The Bell System Technical Journal, Feb. 1970, pp. 291–306.

"Hyper–LP: A System for Power Minimization Using Architectural Transformations," by Chandrakasan et al., IEEE, 1992, pp. 300–303.

* cited by examiner

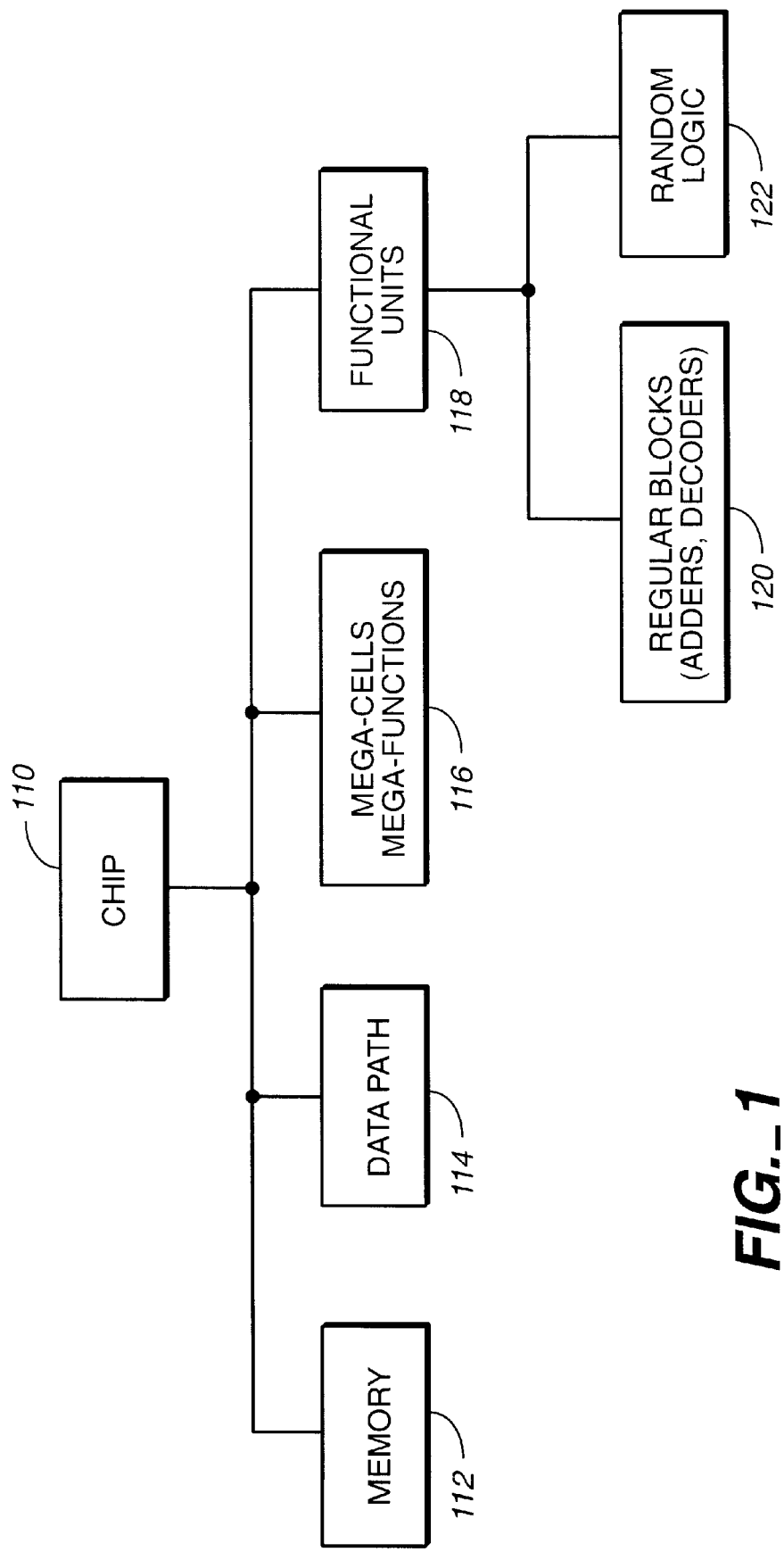
FIG._1

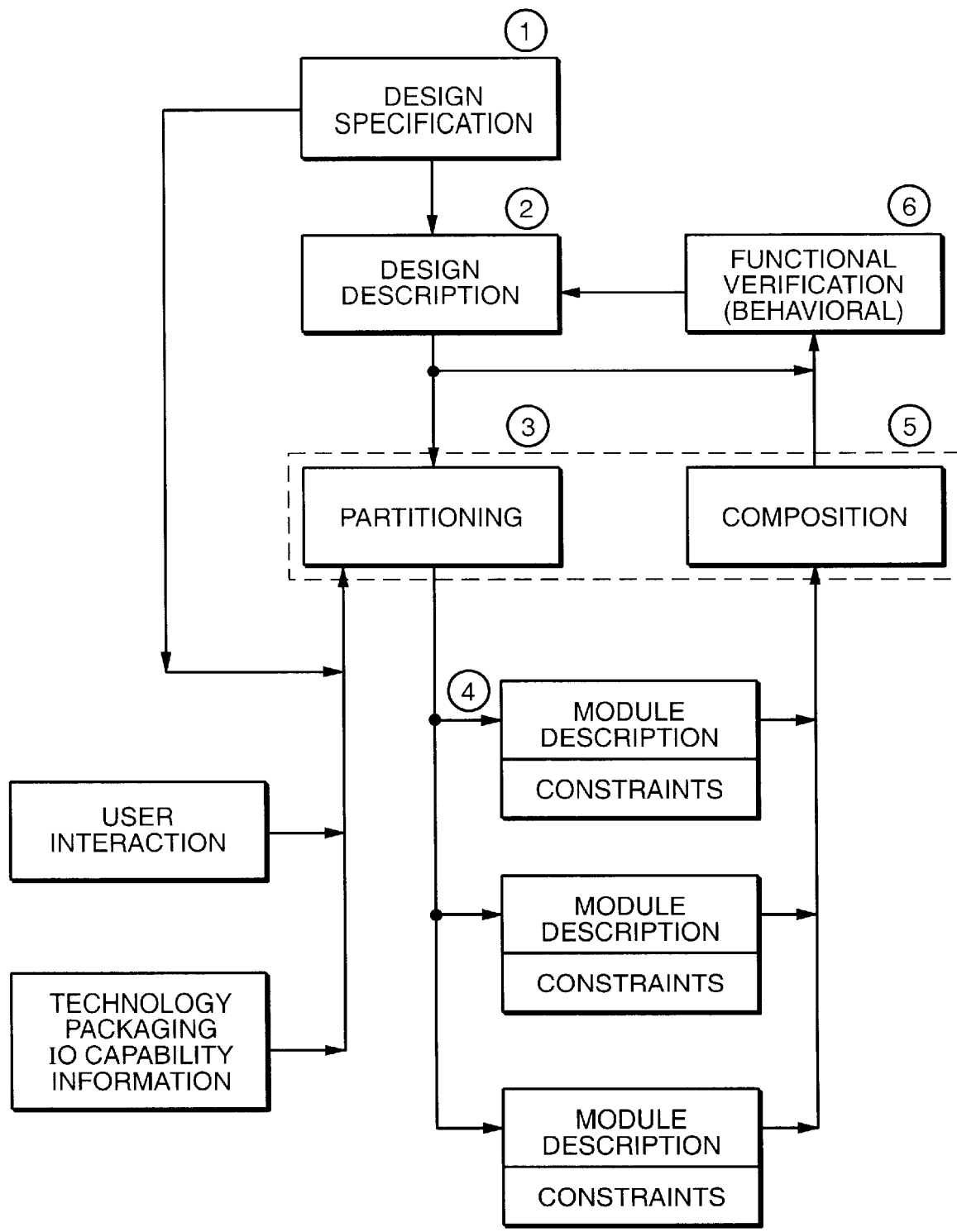
FIG._2

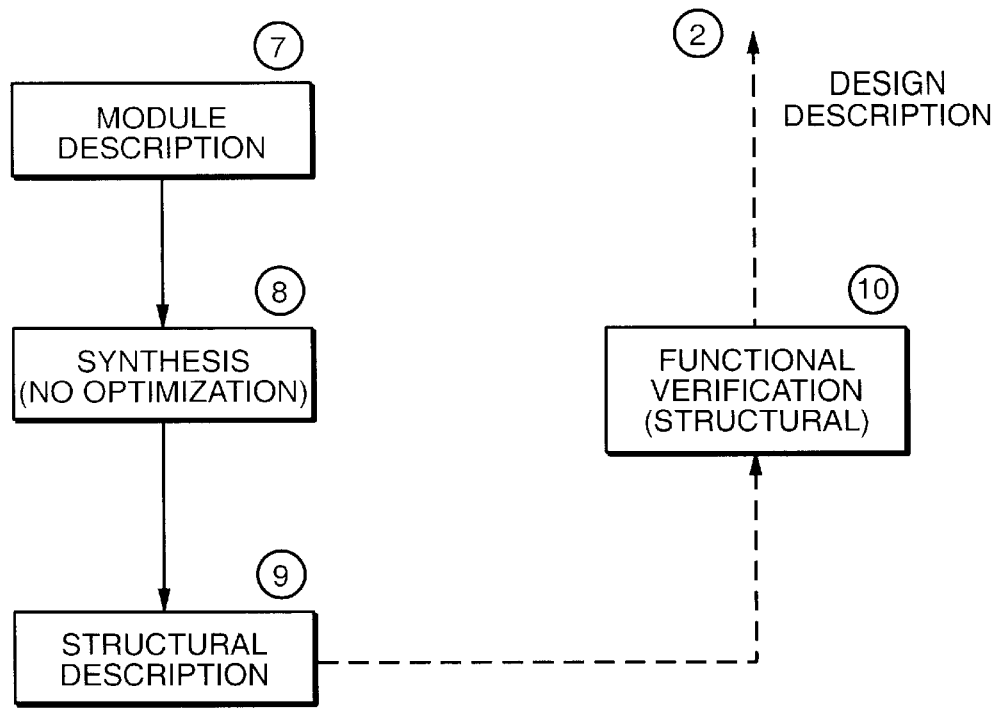
FIG._3
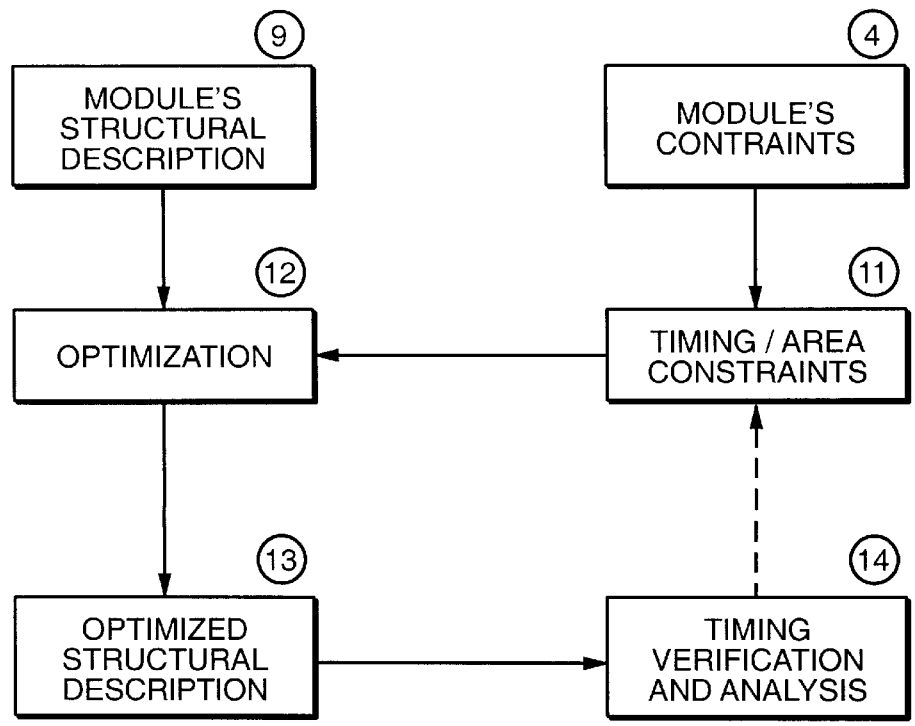
FIG._4

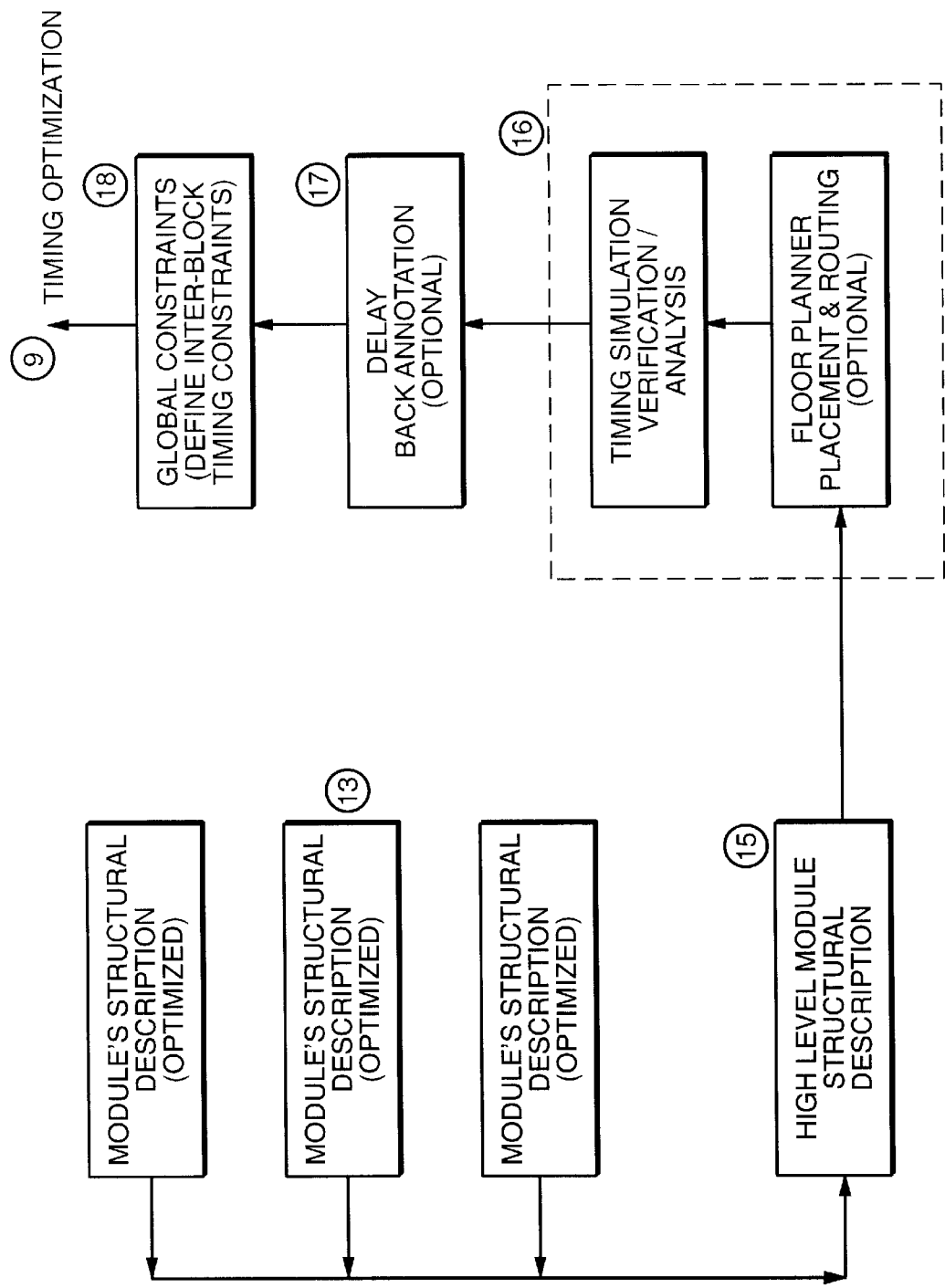
FIG._5

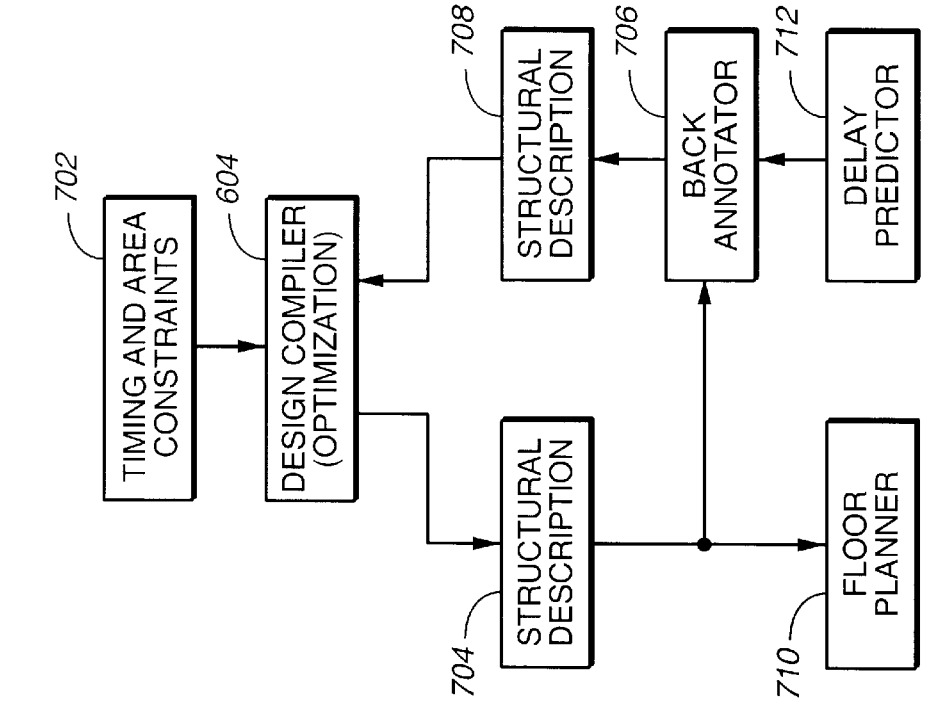
FIG._7
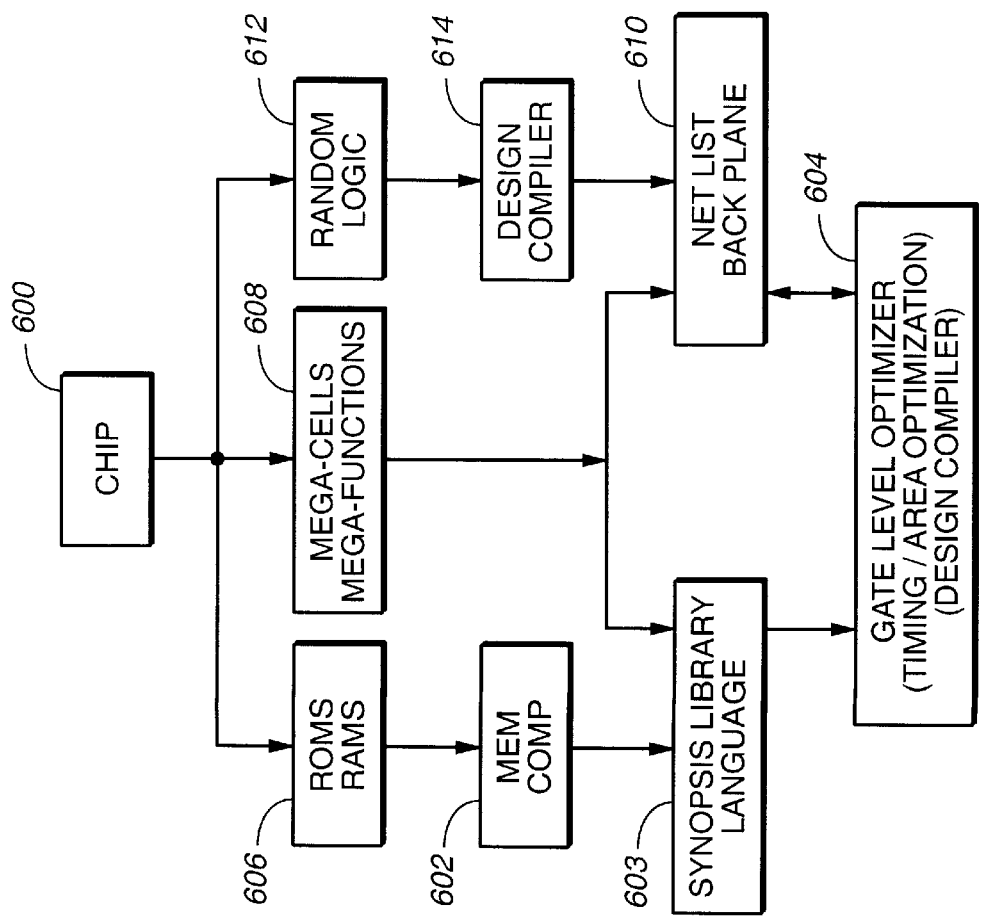
FIG._6

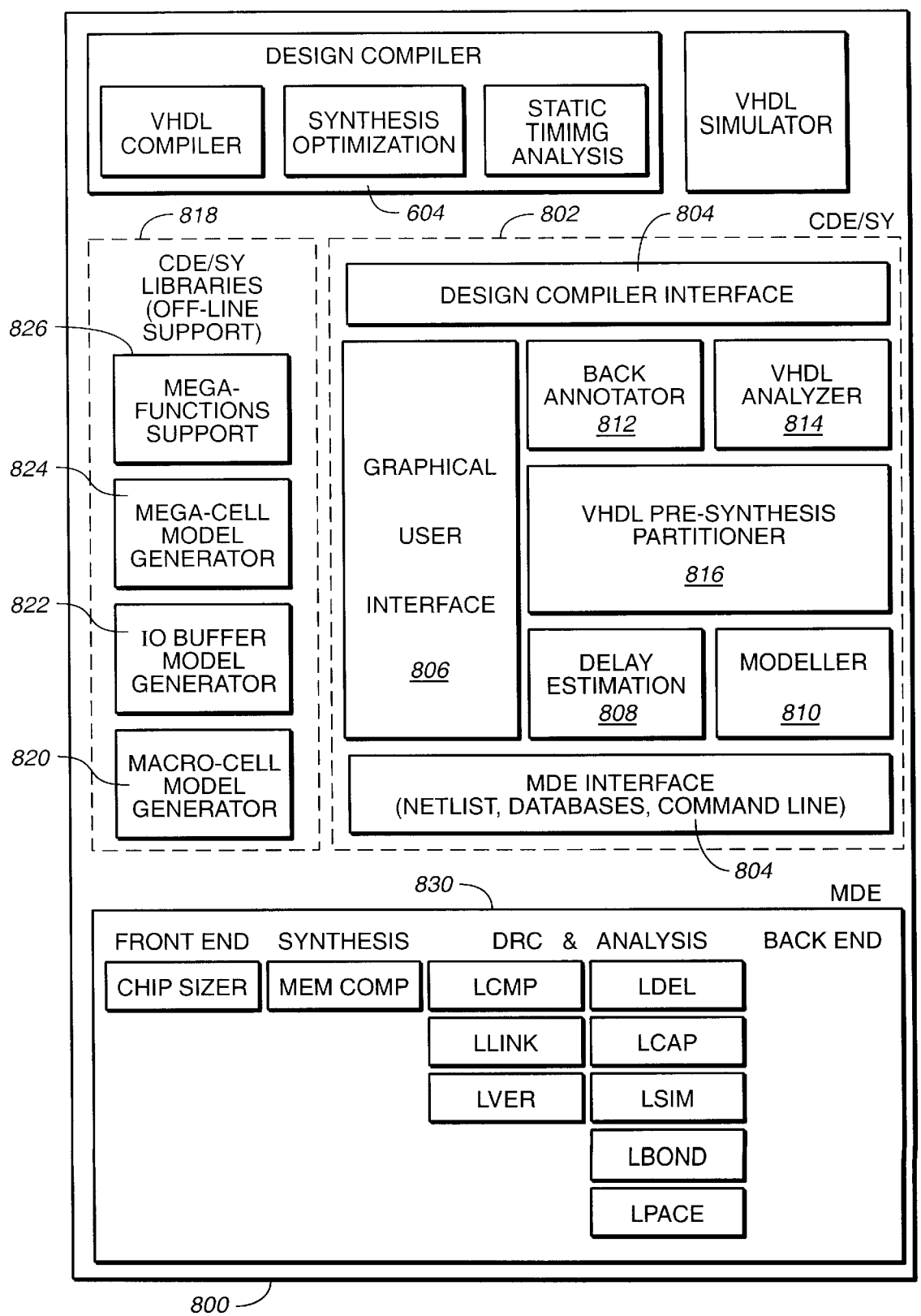
FIG._8

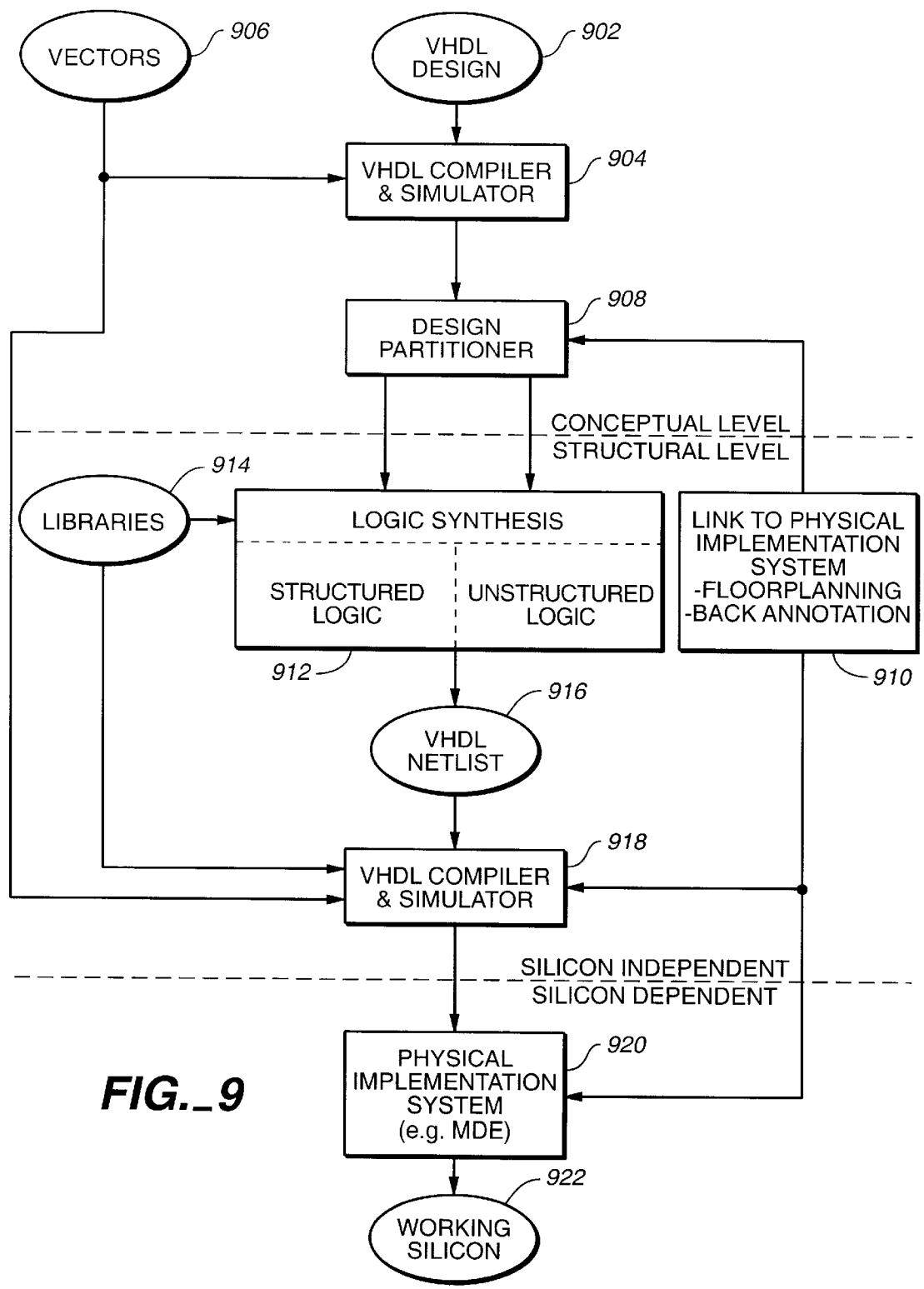
FIG._9

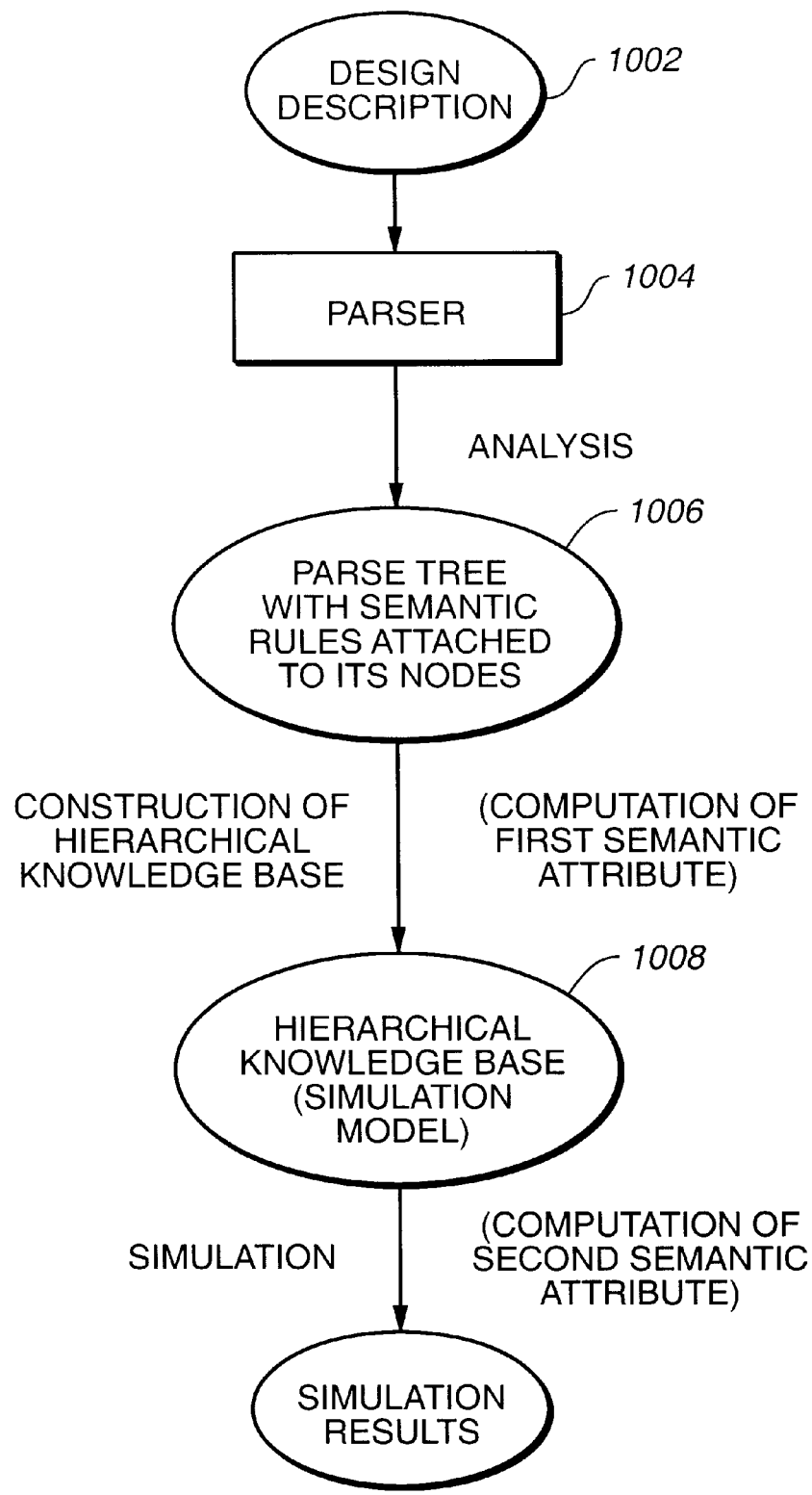
FIG._10

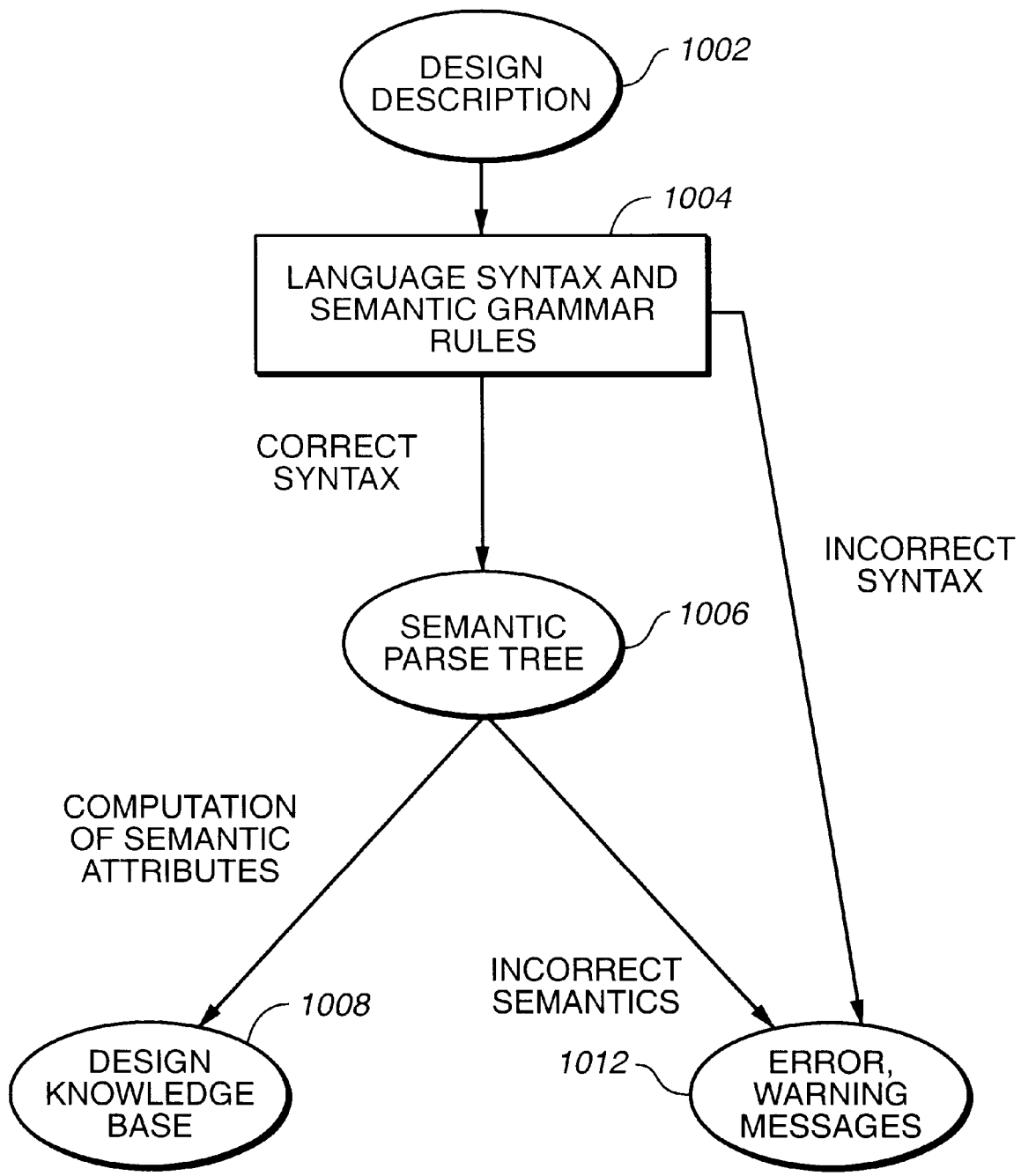
FIG._11

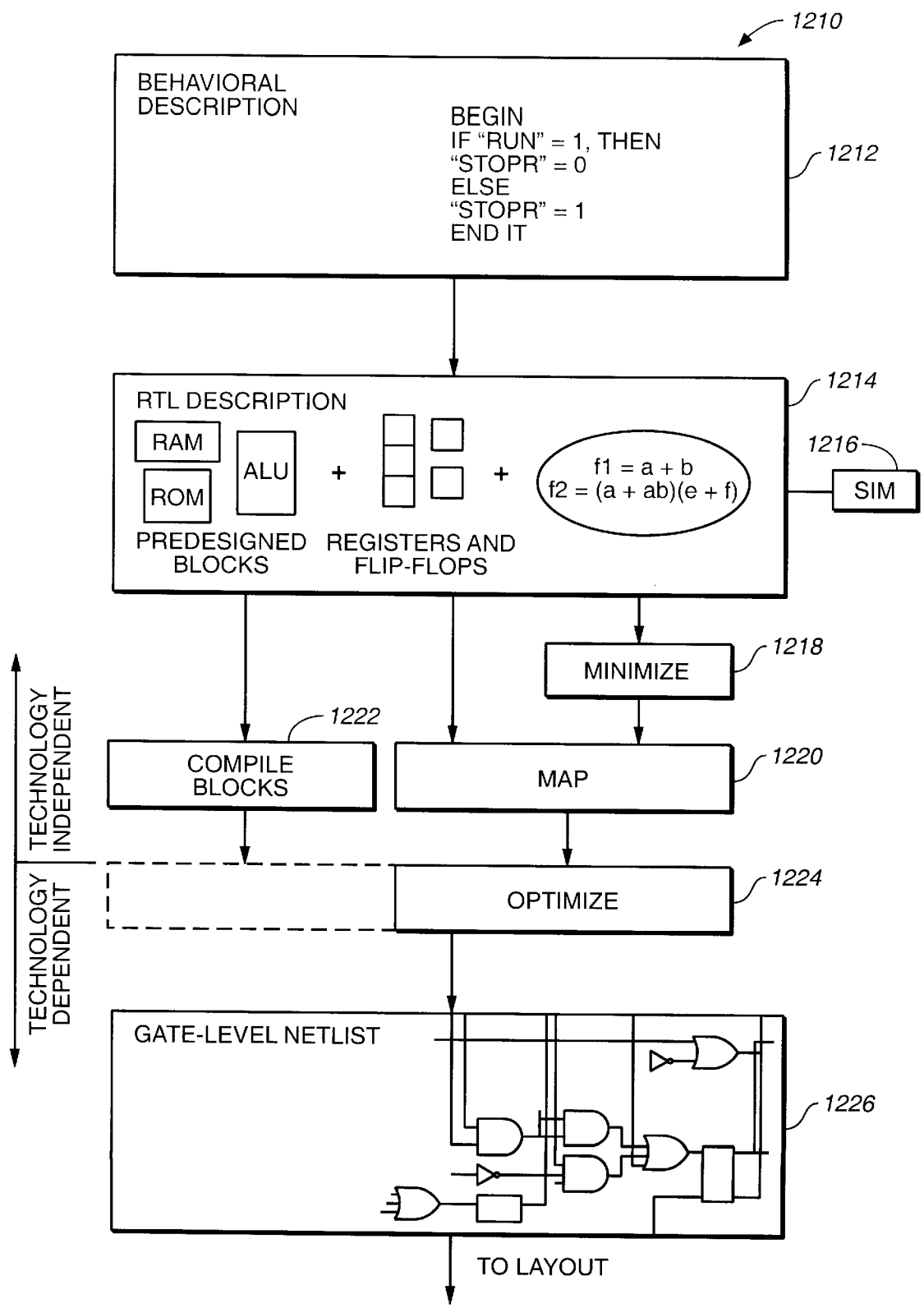
FIG._12

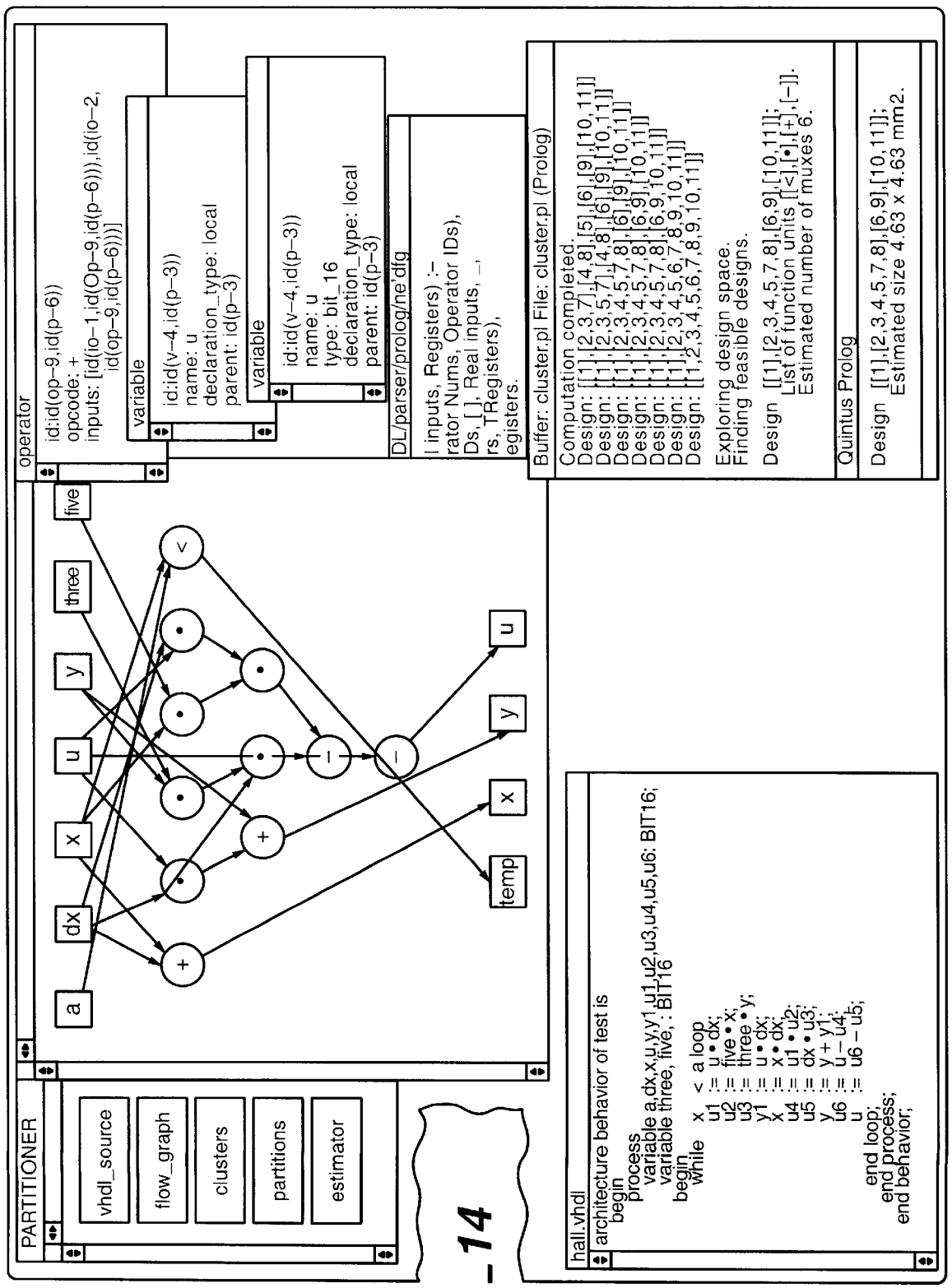
FIG._14

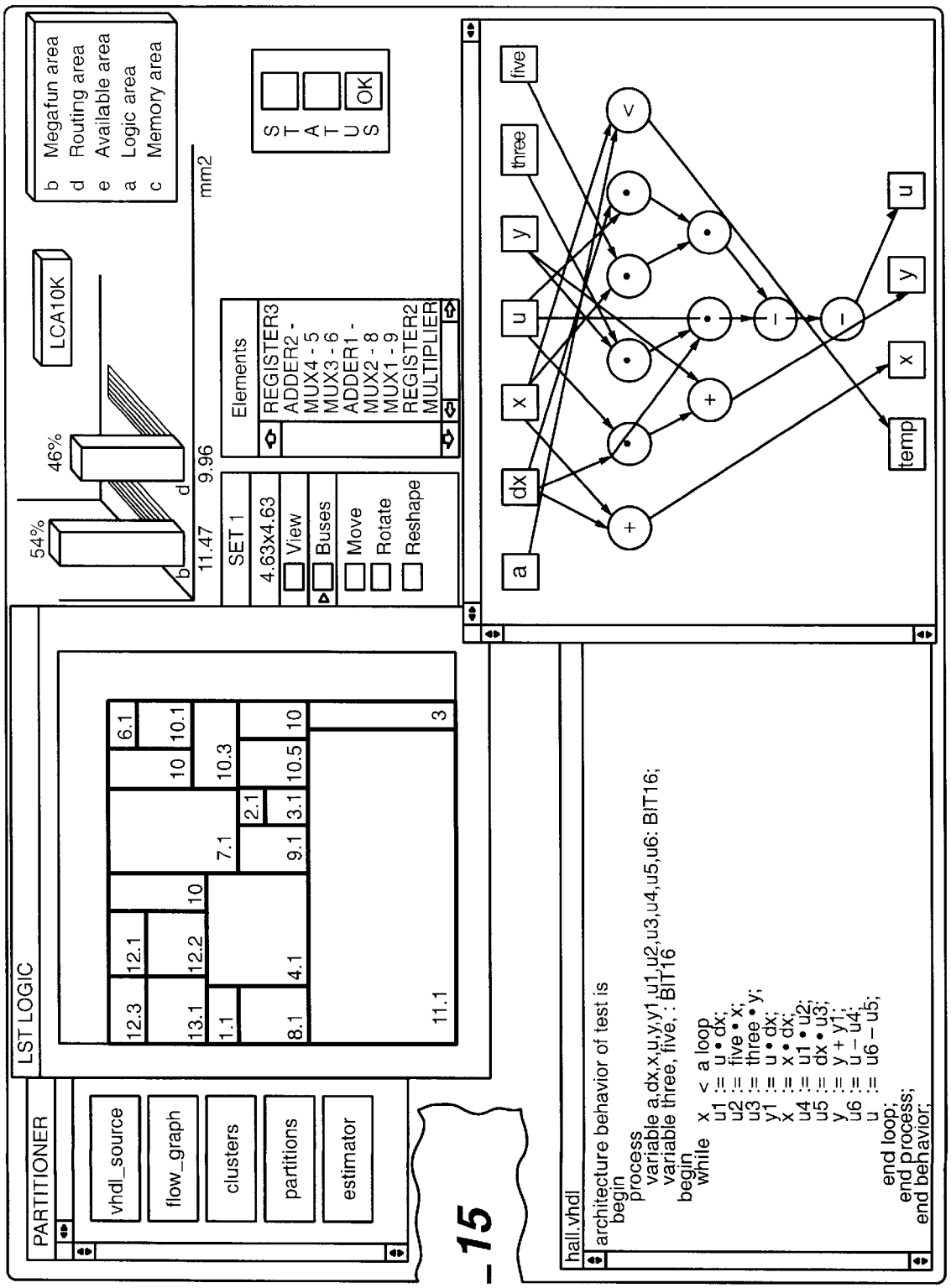
FIG._15

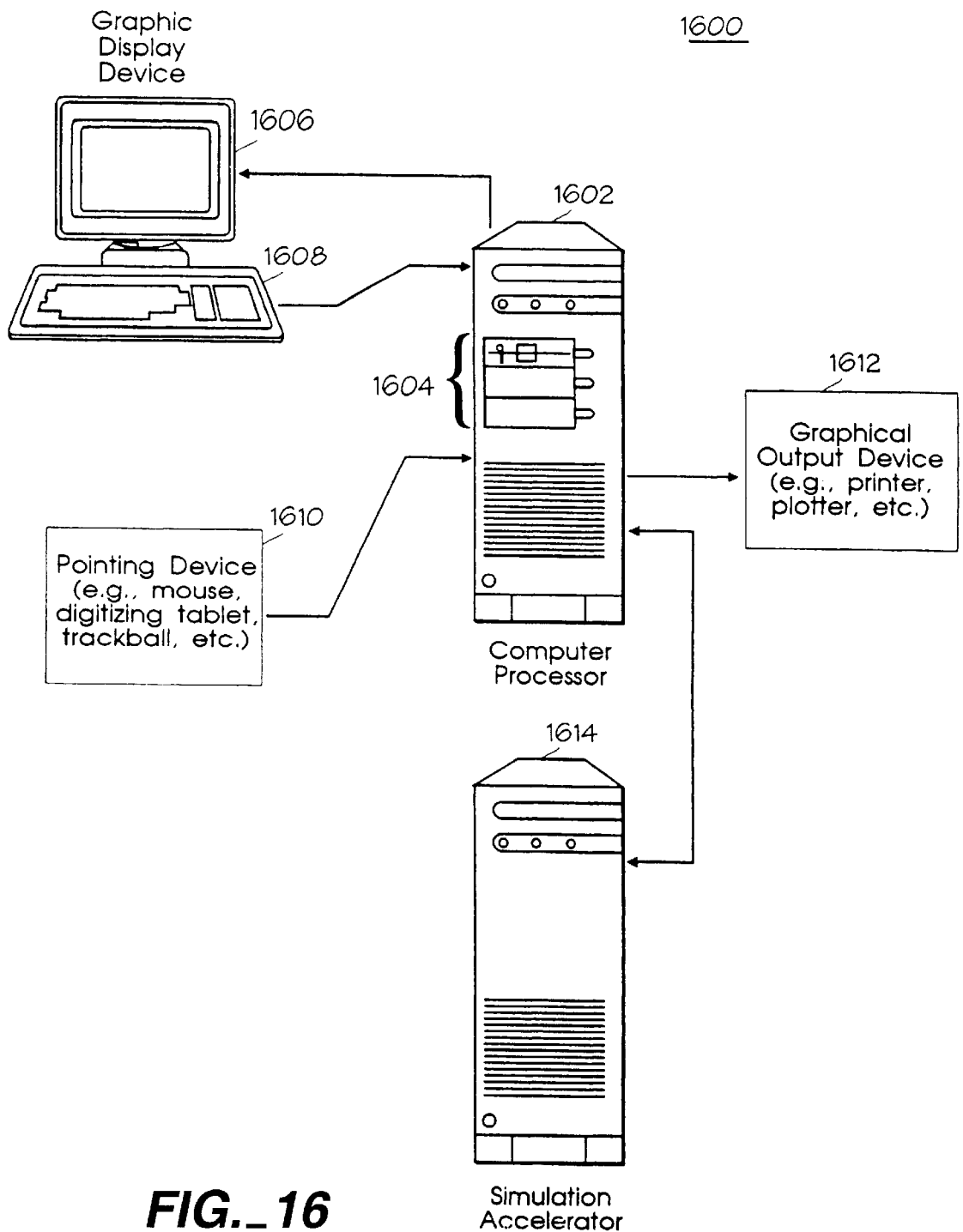
FIG._16

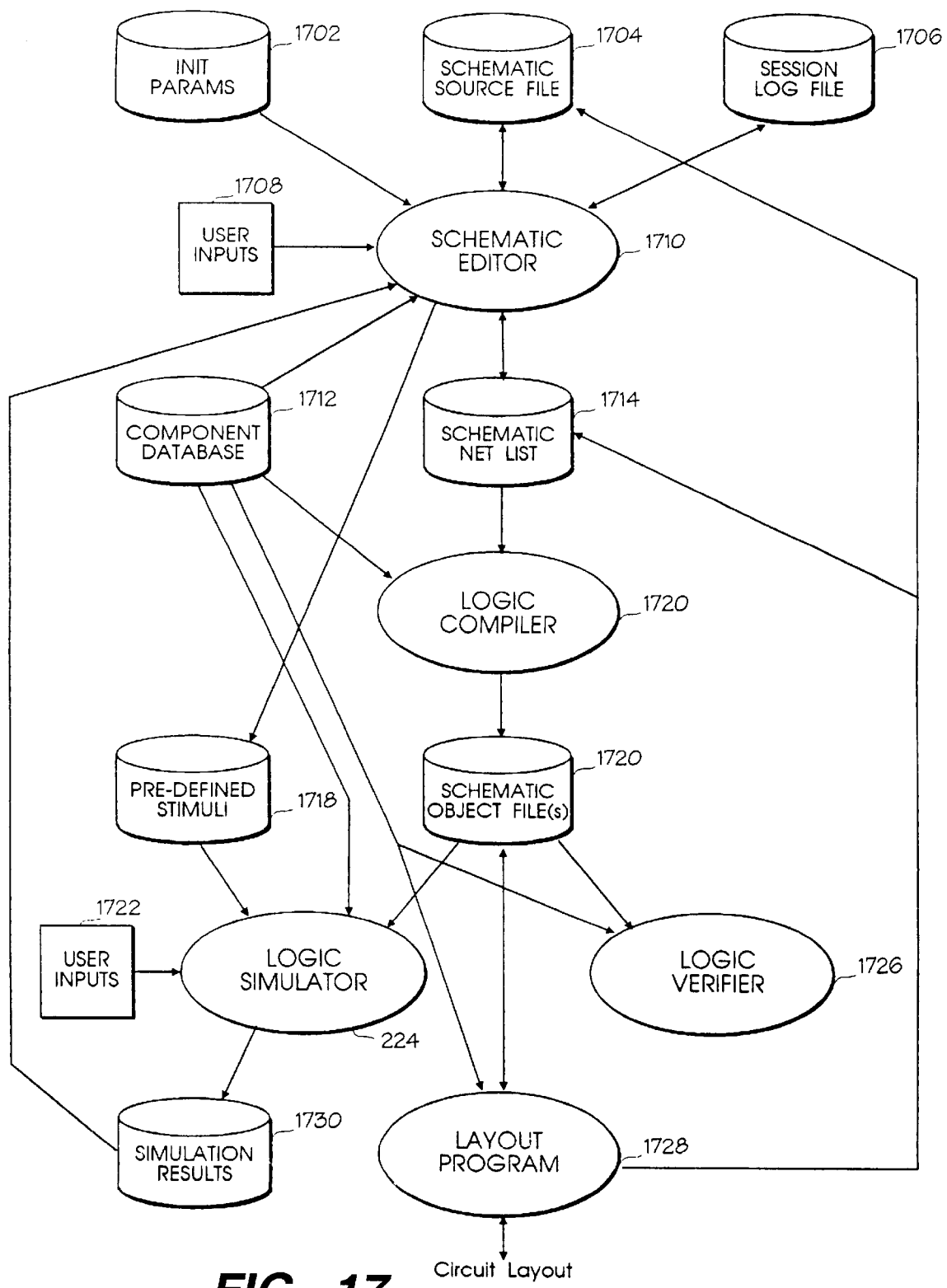
FIG._17

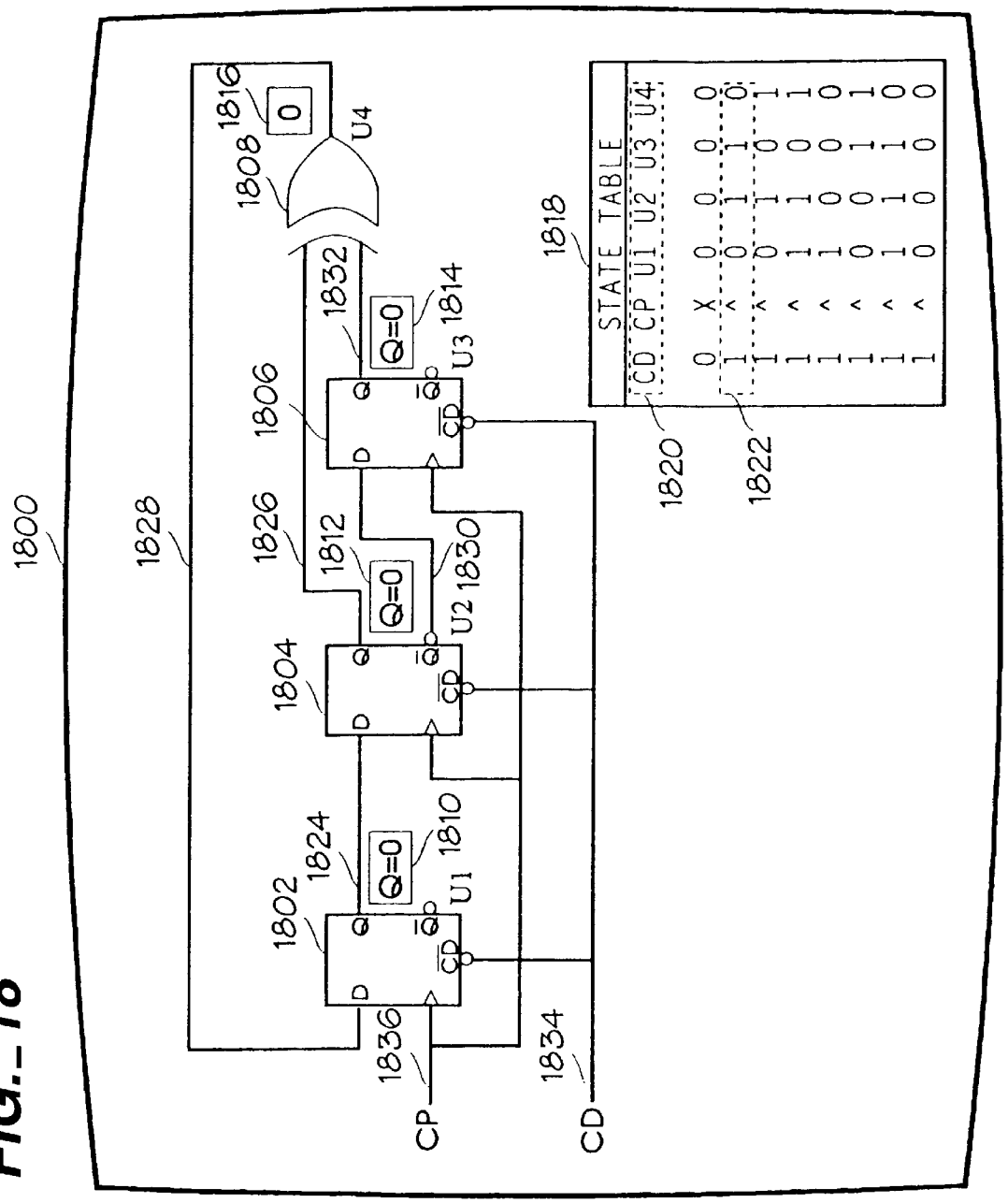
FIG._18

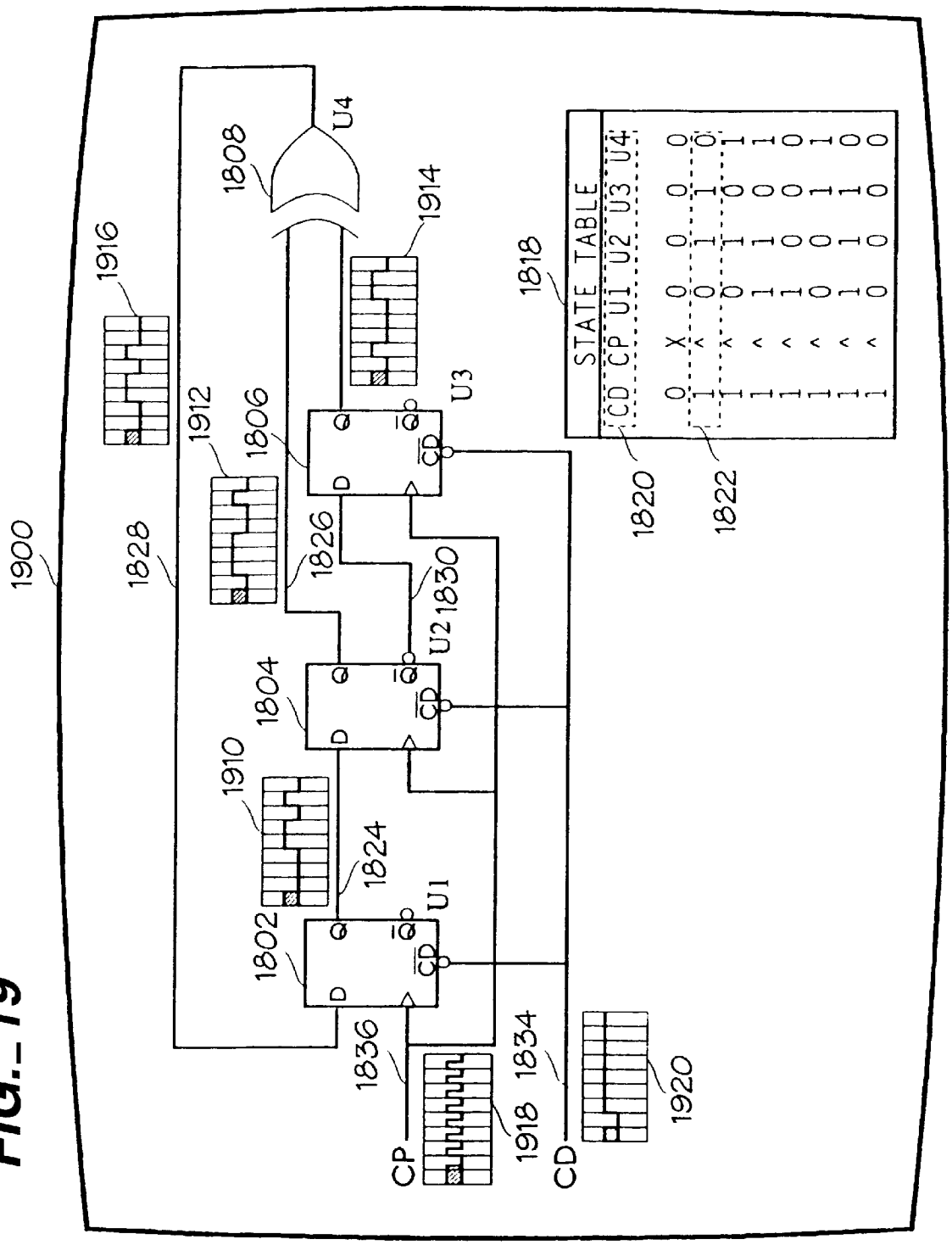
FIG._19

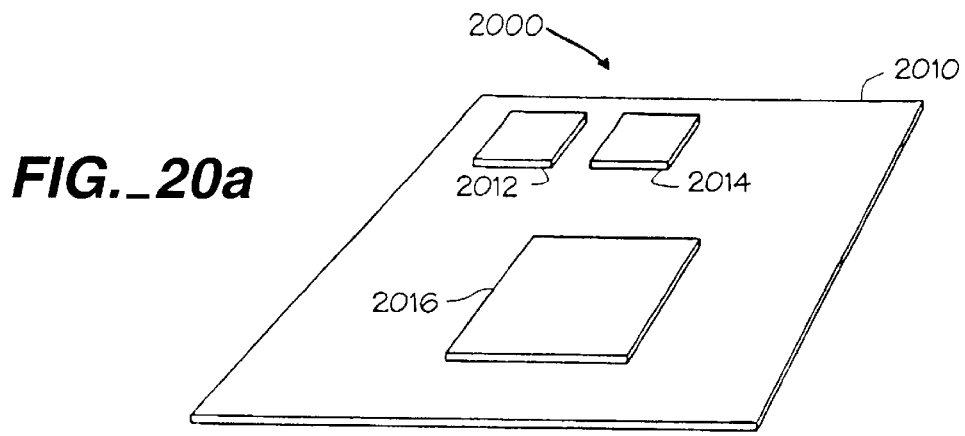
FIG._20a
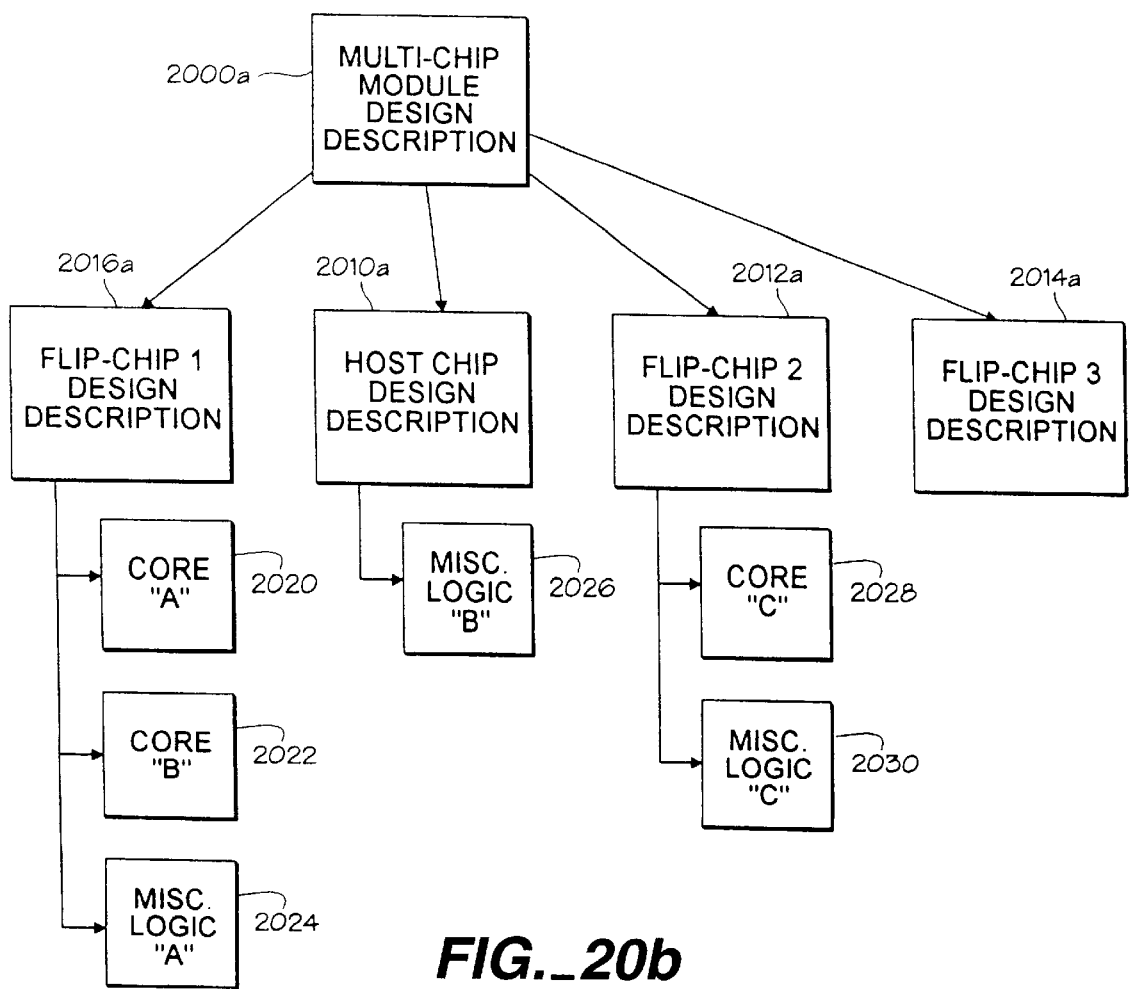
FIG._20b

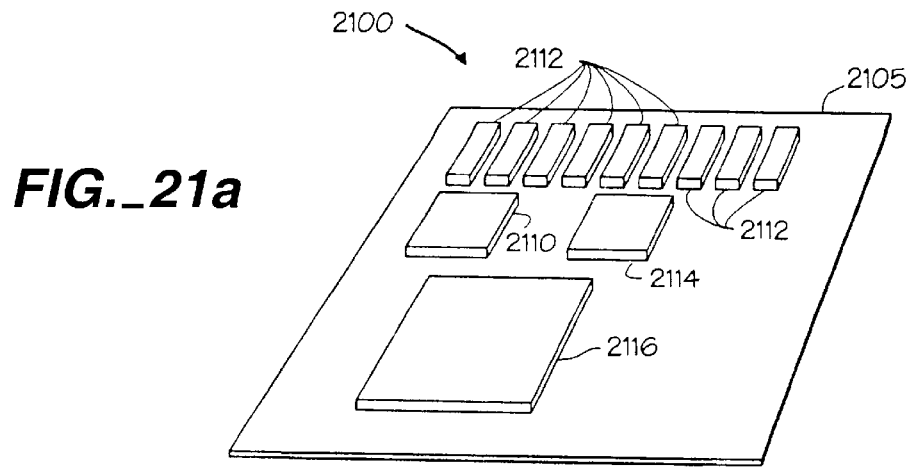
FIG._21a
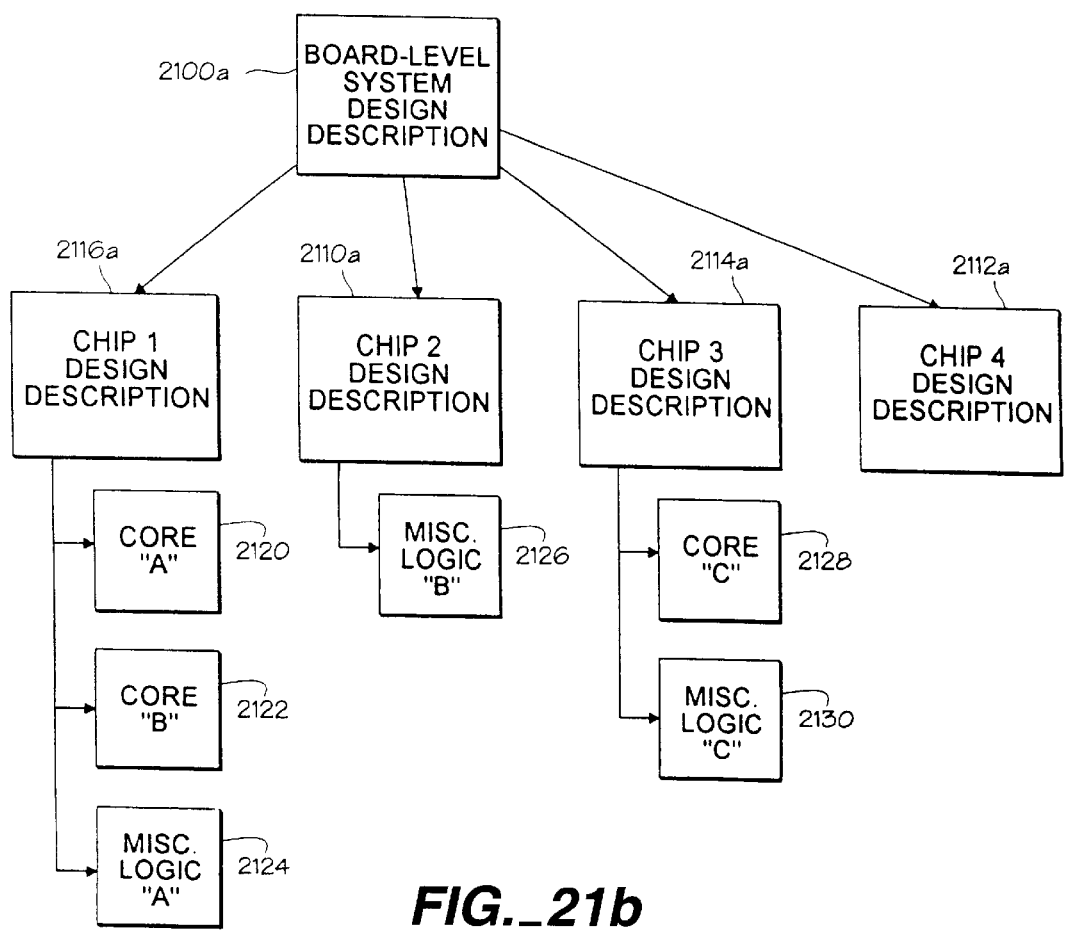
FIG._21b

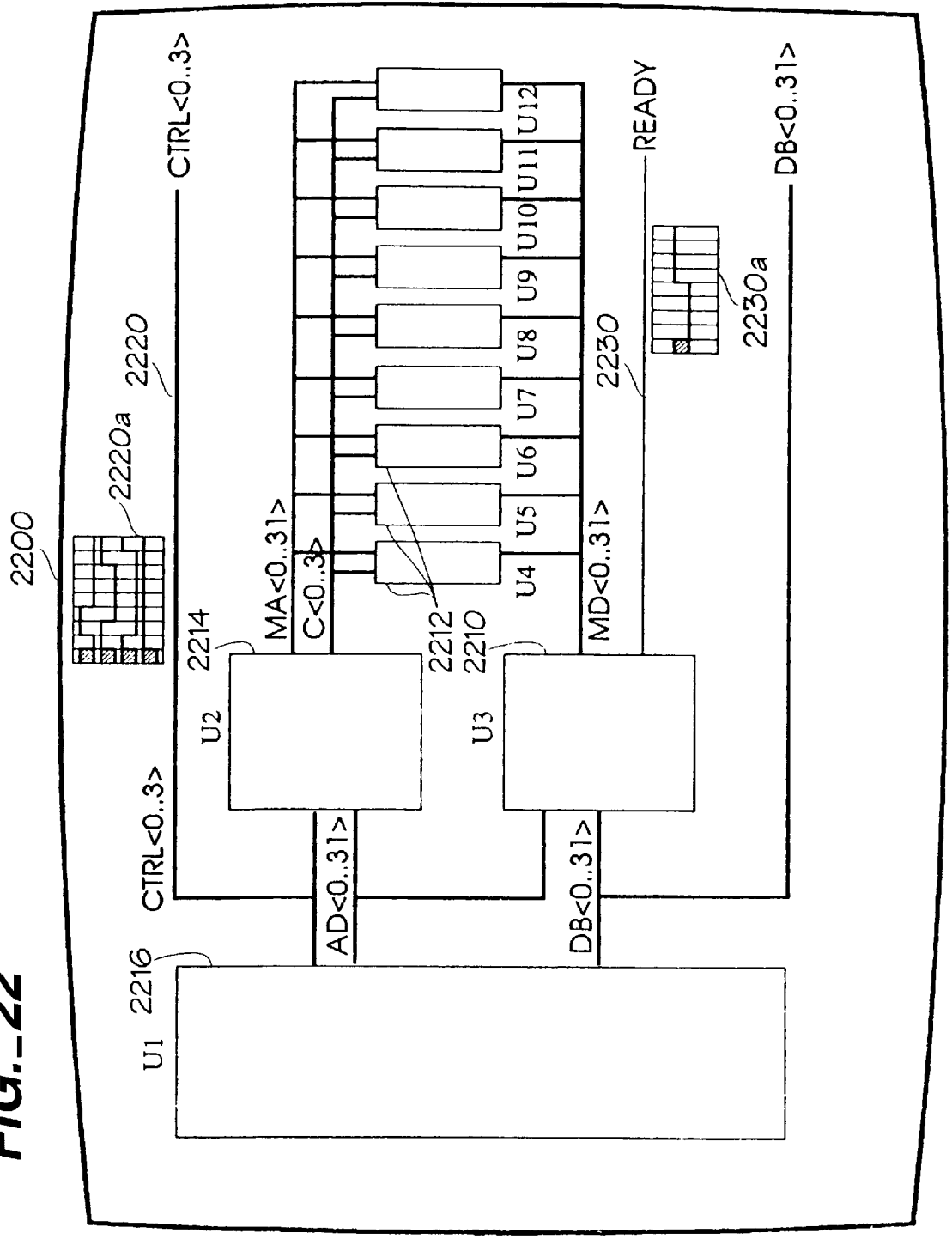
FIG._22

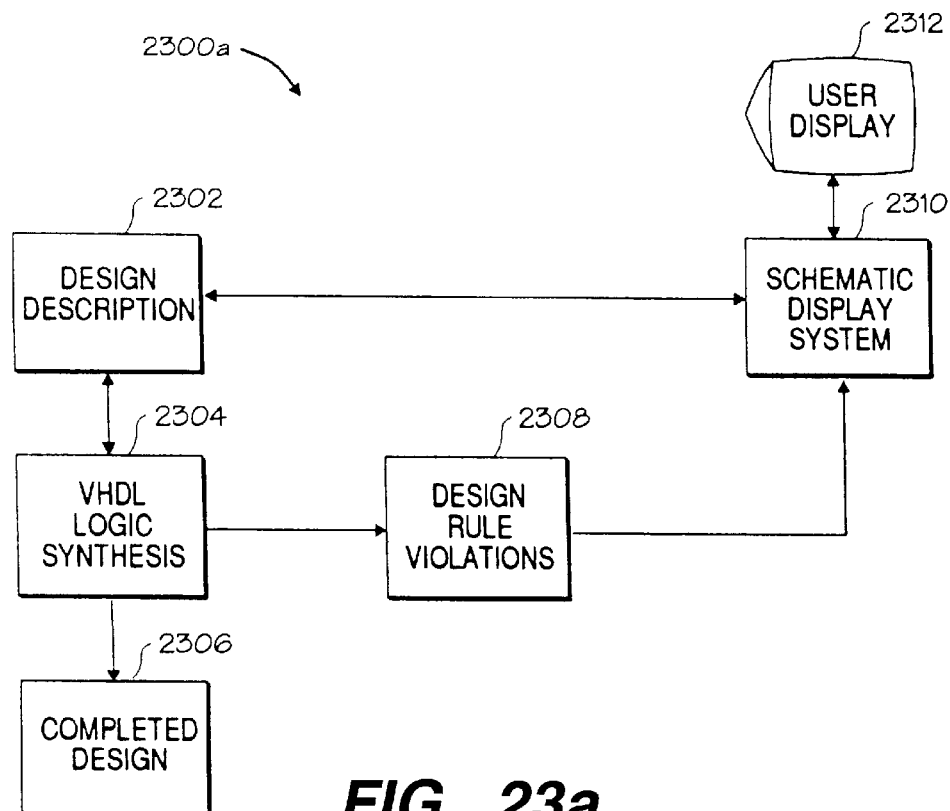
FIG._23a
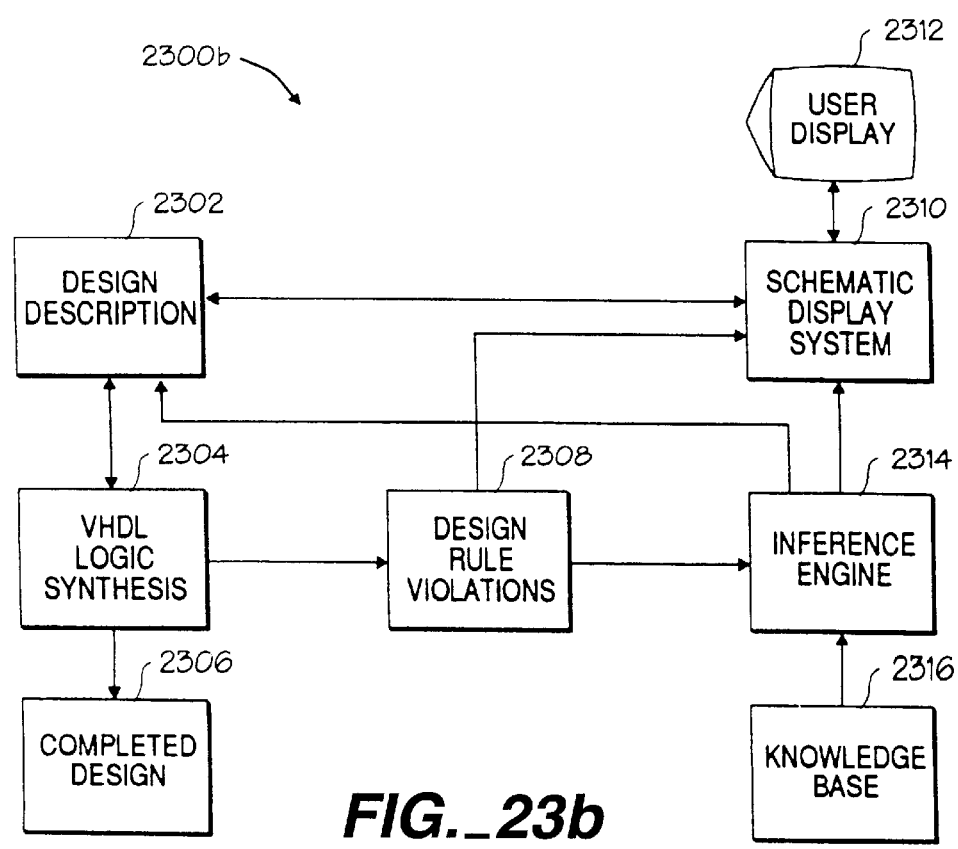
FIG._23b

METHOD AND SYSTEM FOR CREATING, DERIVING AND VALIDATING STRUCTURAL DESCRIPTION OF ELECTRONIC SYSTEM FROM HIGHER LEVEL, BEHAVIOR-ORIENTED DESCRIPTION, INCLUDING INTERACTIVE SCHEMATIC DESIGN AND SIMULATION

CROSS-REFERENCE TO RELATED APPLICATIONS

This is a continuation of Ser. No. 08/077,294 filed Jun. 14, 1993 now U.S. Pat. No. 5,544,067 which is a continuation-in-part of commonly-owned, U.S. patent application Ser. No. 08/054,053, filed Apr. 26, 1993 (abandoned), which is a continuation of commonly-owned, U.S. patent application Ser. No. 07/507,201, filed Apr. 6, 1990 (U.S. Pat. No. 5,222,030; issued Jun. 22, 1993).

This is also a continuation-in-part of commonly-owned, U.S. patent application Ser. No. 07/917,801, filed Jul. 20, 1992 (U.S. Pat. No. 5,220,512; issued Jun. 15, 1993), which is a continuation of U.S. patent application Ser. No. 07/512,129, filed Apr. 19, 1990, (abandoned).

TECHNICAL FIELD OF THE INVENTION

The present invention relates to computer-aided design tools and techniques for the interactive design, implementation, and simulation of complex circuits and systems, particularly digital devices, modules and systems.

BACKGROUND OF THE INVENTION

Present day state-of-the-art design technique, logic synthesis, is really only a mapping between different levels of physical abstraction.

One of the most difficult problems in design automation is the inability to get timing closure at even the gate level effectively. This forces designers to do two designs: logic design and timing design. Otherwise, the designer simply over-designs the circuits, because the best case timing is much different from the worst case timing. In other cases, designers insist on control of device layout so that they can evaluate all of the tradeoffs between implementation and timing.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced. An overall object of an ECAD system is to provide a logic synthesis function.

The Modular Design Environment (MDE) produced by LSI Logic Corporation of Milpitas, Calif., is a suite of software tools for computers running the UNIX operating system. MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

VHDL, or VHSIC (Very High Speed Integrated Circuit) Hardware Description Language, is a recently developed, higher level language for describing complex devices. The form of a VHDL description is described by means of a context-free syntax together with context-dependent syntactic and semantic requirements expressed by narrative rules. VHDL is described in *IEEE Standard VHDL Language Reference Manual* (IEEE Std 1076-1987), and is also known as MIL-STD-454, Regulation 64.

VHDL represents an important step forward in design specification languages because the semantics, or intent, of the language constructs are clearly specified. In theory, VHDL unambiguously describes a designer's intended system or circuit behavior, in syntactic terms. The "design entity" is the primary hardware abstraction in VHDL. It represents a portion of a hardware design that has well-defined inputs and outputs and performs a well-defined function. A design entity may represent an entire system, a sub-system, a board, a chip, a macro-cell, a logic gate, or any level of abstraction in between. A "configuration" can be used to describe how design entities are put together to form a complete design.

VHDL supports three distinct styles for the description of hardware architectures. The first of these is "structural" description, wherein the architecture is expressed as a hierarchical arrangement of interconnected components. The second style is "data-flow" description, in which the architecture is broken down into a set of concurrent register assignments, each of which may be under the control of gating signals. This description subsumes the style of description embodied in register transfer level (RTL) descriptions. The third style is "behavioral" description, wherein the design is described in sequential program statements similar to a high-level programming language. In the main hereinafter, the behavioral description style is discussed. However, all three styles may be intermixed in a single architecture.

A methodology for deriving a lower-level, physically-implementable description, such as a RTL description of the higher level (e.g. VHDL) description, via an intermediate rule-based tool such as Prolog, is disclosed herein.

Prolog is a programming language based on predicate logic. It can be used for "intelligent" tasks like mathematical theorem proving. A Prolog program is a set of rules which define the relationships among objects. The general form of a Prolog rule is a "horn" clause, in which a specified "goal" is true if certain conditions are true. Execution of a Prolog program involves finding a proof for the goal in question, using unification and resolution. An important aspect of Prolog employed in the present invention is "term_ expansion", which converts predefined rules into ordinary Prolog clauses.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for hierarchical design whereby a previously created and stored circuit may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

Typically, the form of user interaction with the schematic editor is an object-oriented screen display whereby the user thereof may manipulate objects on the screen through the use of a pointing device. A pointing device is any device through the use of which a user may "point" to and identify objects on a display screen. Such object-oriented interfaces are well known to those skilled in the art. One example of such and interface is the Macintosh Finder for the Apple Macintosh computer, both produced by Apple Computer, Inc. Another example of such an interface is that of Microsoft Windows, produced by Microsoft Corp. of Redmond, Washington.

In order to simulate the performance of the circuit, it is necessary to run a simulator. A simulator is a software tool which operates on: a digital representation, or simulation model of a circuit, a list of input stimuli representing real inputs, and data about the performance characteristics of the represented circuit elements; and generates a numerical representation of the response of the circuit which may then either be viewed on the display screen as a list of values or further interpreted, often by a separate software program, and presented on the display screen in graphical form. Typically, the graphical presentation is designed to produce an image similar to what one would see on an oscilloscope or logic analyzer screen monitoring a real circuit connected as described in the schematic diagram if the real inputs represented by the list of input stimuli were applied. The simulator may be run either on the same computer which is used for schematic entry, or on another piece of electronic apparatus specially designed for simulation. Simulators which run entirely in software on a general purpose computer, whether the same as or different from the one used for schematic entry, will hereinafter be referred to as software simulators. Simulations which are run with the assistance of specially designed electronic apparatus will hereinafter be referred to as hardware simulators. An example of a such a hardware simulator is described in U.S. Pat. No. 4,587,625, entitled PROCESS FOR SIMULATING DIGITAL STRUCTURES. Usually, software simulators perform a very large number of calculations compared to the number required for schematic entry and operate slowly from the user's point of view. In order to optimize performance, the format of the simulation model is designed for very efficient use by the simulator. Hardware simulators, by nature, require that the simulation model comprising the circuit description and its performance parameters be communicated in a specially designed format. In either case, a translation process is required.

Simulation is often provided by utilizing simulation models at one or more of several different levels. Component-level models attempt to describe the exact behavior of a specific component, such as a gate or transistor, when it is acted upon by a stimulus or stimuli. Behavioral-level models provide a simplified model of extremely complicated devices, such as a microprocessor, or an operational amplifier. Such models, if simulated exactly on a transistor by transistor basis, would become prohibitive in terms of the size of their descriptions and the number of calculations and amount of computing time required to completely simulate their function. In response to this, the behavioral-level model provides a logical or mathematical equation or set of equations describing the behavior of the component, viewed as a "black box". Such models may either provide a very complete and accurate description of the performance of the modeled device, or a simple description of the types of signals one might expect the modeled device to produce. For example, a behavioral model of a microprocessor might provide the user with the capability of issuing various types of bus cycles, but not the capacity to actually simulate the execution of a program. Circuit-level models typically comprise a plurality of component-level and/or behavioral-level models and the descriptions of their interconnections for the purpose of simulating the performance of a complete circuit comprising a number of interconnected components. Simulations of hierarchical designs require that the included macro-level components also be simulated. Circuit-level or behavioral-level models of the macro-level components may be used to simplify this task.

The simulation model used by the simulator is usually derived from the output of the schematic editor by a schematic compiler, also making use of information about performance characteristics of the circuits, often stored in simulation libraries. Simulation libraries contain simulation characteristics of numerous circuit components and are typically maintained in files on the computer's on-line storage devices. The schematic compiler is a software tool which interprets the circuit element and interconnection information generated by the schematic editor and the performance characteristics stored in the simulation libraries, and reorganizes and translates them into the simulation model for the circuit. Occasionally, either the simulator or the schematic editor includes the function of a schematic compiler, in which case, separate compilation is not required.

Simulators often allow several different types of simulation. One type is a complete simulation run, where an initial set of conditions is specified, a set of input stimuli is defined and the duration of the simulated run is specified. The simulator then operates on the data and produces a file of the results which may be displayed. Another type of simulation, similar to the complete simulation run is an event-terminated run, whereby the simulation is run until a certain pre-specified event occurs in the simulation results. The simulation may be terminated immediately at that point, or run for some simulated duration afterwards. One final type of simulation run is a stepped simulation run, whereby the current simulation may be "stepped" by one unit of time, or one clock cycle, or some other similar criterion.

The process of designing an electronic circuit on a typical ECAD system is done in several discrete steps. A schematic diagram of the circuit is entered interactively through the use of a schematic editor which produces a digital representation of the circuit elements and their interconnections. The user of the ECAD system then prepares a list of input stimuli representing real input values to be applied to the simulation model of the circuit. This representation is then compiled by a schematic compiler and translated into a form which is best suited to simulation. This new, translated representation of the circuit is then operated upon by a simulator, which produces numerical output analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

While the design process outlined herein is significantly faster and less error prone than manual design, the user must still go through the design process in a number of discrete, disjointed steps. The design process is broken into two or three separate thought processes. First, the user must enter the schematic into the computer using a schematic editor. Second, the user completes the schematic entry process and instructs the appropriate software tool (schematic editor, schematic compiler, or simulator) to prepare the design for simulation. Third, the user must create simulation stimuli, usually with the assistance of yet another software tool, and instruct the simulator to apply these stimuli to the simulation model of the circuit being designed. The results are viewed by the user, who then makes a judgement about whether the design is performing correctly.

In modern digital systems, designs incorporating 20,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

This need for frequent, partial simulation is somewhat frustrated by current ECAD systems which require the user to break his train of thought in the design process and to move from one tool to the next. Some ECAD systems have begun to attack this problem by providing "windowed" displays, whereby the user may display the output of several software programs at once on different portions of the display screen. This design environment, however is still not fully interactive. In order to simulate small portions of a circuit, the user may need to design special test circuits incorporating those small portions of the circuit and simulate them in isolation.

DISCLOSURE OF THE INVENTION

It is therefore an object of the present invention to provide an improved ECAD system whereby the characteristics of schematic editor, schematic compiler, and simulator are all presented to the user in a fashion such that they appear as a single, integrated function.

It is a further object of the present invention to allow portions of a circuit which is being designed on such an improved ECAD system to be simulated in isolation without requiring that those circuit portions be copied to another schematic, regardless of whether or not the overall schematic diagram has been completed, and regardless of whether or not the circuit portion has other connections.

It is a further object of the present invention to allow the user to view full or partial simulation results on the display screen representation of the schematic as it is being edited on the improved ECAD system.

It is a further object of the invention to enable the user to view state, performance, loading, drive strength or other relevant data (hereinafter, "state" data) in display areas immediately adjacent to the schematic object to which it pertains.

It is a further object of the invention to enable the user to perform simulator setup on the schematic diagram by using point and select techniques to identify items to be simulated, input values, override values, and points to be monitored.

It is a further object of the invention to enable the user to create state tables for circuits, portions of circuits, or components.

It is a further object of the invention to enable the user to store the interactive state data for viewing at another time.

It is a further object of the invention to enable the user to create macros to move through the simulation in defined steps (of "n" time units of the lowest system granularity), or to cycle a clock.

It is a further object of the invention to enable the user to pop up data sheets or any library element being used, and further to allow the user to define his/her own data sheets and to allow these to be popped up in the schematic editor environment.

It is a further object of the present invention to provide a methodology for deriving a valid structural description of a circuit or system from a behavioral description thereof, thereby allowing a designer to work at higher levels of abstraction and with larger, more complex circuits and systems.

It is a further object of the present invention to provide a technique for automatically translating behavioral descriptions of a circuit or system into physical implementations thereof.

It is a further object of the present invention to provide an improved logic synthesis function for an ECAD system.

It is further object of the invention to raise the level of design validation from a structural (net list) level to a behavioral level.

It is a further object of the invention to provide a more standardized design environment, thereby alleviating the need for cross-training between different design platforms and allowing resources to be directed more towards synthesis and testability.

It is a further object of the invention to provide a technique interactive design, synthesis, simulation and graphical display of electronic systems.

It is a further object of the present invention to provide a technique for indicating the source of design rule violations in a logic synthesis or design process to a user.

It is a further object of the present invention to provide a technique for automatically providing suggestions to a user about possible alterations or corrections to a design or design description of an electronic system which violates design rules.

It is a further object of the invention to accomplish the above objects in a manner compatible with the design of board-level systems, multi-chip modules, integrated circuit chips, and ASICs using core modules.

It is a further object of the invention to accomplish the above objects independently of scale, complexity, or form factor of the electronic system.

SUMMARY OF THE INVENTION

According to the invention, there is provided an electronic CAD system operated with a suite of software tools for enabling a designer to create and validate a structural description and physical implementation of a circuit or system (hereinafter, "device") from a behavior-oriented description using a high-level computer language. The methodology includes the following steps:

First, the designer specifies the desired behavior of the device in a high-level language, such as VHDL. The description includes high-level timing goals.

Next, in a "behavioral simulation" step, starting with the VHDL behavioral description of a design, the designer iterates through simulation and design changes until the desired behavior is obtained.

Next, in a "partitioning" step, the design is partitioned into a number of architectural blocks. This step is effectively one of exploring the "design space" of architectural choices which can implement the design behavior. Links to the physical design system enable high level timing closure by constraining the feasible architectural choices to those which meet the high-level timing and area (size) goals. This is a key step because it represents the bridge between the conceptual level and the physical level. A second function of this step is to direct the various architectural blocks to the appropriate synthesis programs.

Next, in a "logic synthesis" step, a number of separate programs are used to efficiently synthesize the different architectural blocks identified in the partitioning step. Those blocks having highly regular structures or well understood functions are directed to specific synthesis tools (e.g. memory or function compilers). Those blocks with random or unstructured logic are directed to more general logic synthesis programs. The output of this step is a net list of the design.

Next, in a "physical simulation" step, the gate-level design description is simulated, comparing the results with those from the initial behavioral simulation. This provides a check that the circuit implementation behaves as intended, and that the timing goals are achieved.

Optionally, the design is back-annotated to ensure that other physical design limitations, such as capacitive loads and parasitics, are not exceeded.

Finally the design is input to existing software systems which control the physical implementation of the design, such as in an ASIC (Application Specific Integrated Circuit) device.

An important feature of the present invention is that, as with all top-down design approaches, the foregoing is a process of architectural refinement in which design realization moves down through levels of abstraction. The characteristics of VHDL and the disclosed methodology enable this process to occur without losing the intent and meaning present at higher levels. This is the key to automating the process.

Another important feature is that the partitioning step, or partitioner, in effect, uses high-level timing information extracted from the chip floorplan to constrain the design into the feasible architectural choices which meet the high-level timing goals. These constraints are key to allowing the process to converge to specific physical embodiments.

Another important feature is that the methodology enables timing closure without going to actual layout, solving one of the most difficult problems in design automation today, namely the inability to get timing closure at even the gate level effectively which in the past has forced designers to create two designs: a logic design and a timing design. Using the methodology disclosed herein, timing closure can be obtained by using a form of back annotation which will extract timing data from floorplanning-level layouts and then incorporate this data into the I/O (Input/Output) ports of the VHDL behavioral description.

According to an aspect of the invention, the behavioral (VHDL) description of the device is interpreted by attaching one or more semantic rules to each of the syntactic rules underlying the behavioral description. This is accomplished (such as via Prolog) using a "syntax attributed tree".

According to the invention, the electronic CAD system comprises a computer processor, mass storage, a display screen, means for user input, and means for circuit simulation. The electronic hardware of the means for simulation may comprise the ECAD system's computer, one or more general purpose computers interfaced to the ECAD system's computer, one or more hardware simulators interfaced to the ECAD system's computer, or any combination of these. The user interacts with the ECAD system through the use of an object-oriented user interface, whereby the user may create, select, move, modify and delete objects on the display screen, where objects may represent circuit components, wires, commands, text values, or any other visual representation of data. The graphical and software techniques of interacting with a user on such an object-oriented user interface are well known to those skilled in the art and need not be elaborated upon in this discussion.

A component database resides on the ECAD system's mass storage. This database comprises a number of data objects: graphical symbols, connection information, timing parameters, and simulation models corresponding to various electronic components. These data objects contain all of the information necessary to display, interconnect, and edit schematic symbols on a graphical display screen. The simulation model data objects contain the behavioral data corresponding to the components represented by the graphical objects such that the simulator may produce results closely approximating those that would be observed if real components were used and measured on standard laboratory instrumentation.

Five major software program functions run on the ECAD system: a schematic editor, a logic compiler, a logic simulator, a logic verifier, and a layout program. The schematic editor program allows the user of the system to enter and/or modify a schematic diagram using the display screen, generating a net-list (summary of connections between components) in the process. The logic compiler takes the net list as an input, and using the component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

These programs are typical of similar, discrete programs existing in the current art, but are slightly modified (improved in their functionality) in the source of their control information. The editor's user interface is extended such that the simulator functions may be requested by the user. It is further modified such that whenever a change is made to the schematic, the editor updates its output files (net list, etc.) and signals the logic compiler to re-compile the schematic using the new data. The logic compiler is modified to accept such commands directly from the editor, rather than from user input. The simulator is modified such that it can accept directly from the editor: requests for simulation runs, initial data, signal data, and other information usually entered by the user via the keyboard and/or pointing device. It is further modified to signal the editor that it has completed a simulation operation, and to provide its results in the form of a data structure, either in memory or in a disk file, rather than to the display screen. The logic verifier is also modified such that it interacts with the editor directly, rather than with the display screen and keyboard/pointing device.

Further according to the invention, the editor causes the logic compiler to re-compile the schematic each time a graphical object (schematic symbol) is added, modified, or deleted, and each time a connection is made, changed or removed. In this way, the editor ensures that the net-list and simulation structures are always current and representative of the schematic diagram as displayed on the ECAD system's graphical display screen.

At any time, the user may instruct the editor to create areas on the display screen adjacent to selected schematic symbol connection points (pins) or on connection nets (wires). By conventions already in place in all editors, compilers, and simulators, these connection points and/or connection nets are uniquely identifiable. The user may specify that these data areas are to contain textual state data, or graphical state data. Next the user may identify certain signal values to be injected into the circuit representation. Ordinarily these would be input signals, but for simulation of part of the schematic, it is possible to override the outputs of selected schematic object to force special conditions to exist on a net, or to force signals into a particular input connection point on a schematic object, effectively overriding its connection. It is also possible for the user to indicate that only certain components are to be compiled and simulated, thus improving the compile and simulation times. This is accomplished by one of two means: either subset net-list and object files are created, reducing the amount of data to be handled by the logic compiler and logic simulator, or software flags are provided in the data structures indicating which data objects are to be considered active, allowing the logic compiler to selectively compile the schematic and allowing the logic simulator to selectively simulate the schematic.

All of the user input occurs by pointing with the pointing device and selecting connection nodes, nets or devices and issuing commands which affect the selected object's numerical parameters. Each data object (schematic symbol, connection net (wire), and connection point (pin)) has special parameters which allow it to be made eligible or ineligible for compile and/or simulation, and to have some or all of its other parameters overridden for the purposes of simulation.

When the user wishes to perform a simulation he issues a command which is relayed by the editor to the simulator. The simulator performs a simulation run according to the user's specification and places the simulation results into a data structure. It signals the editor that the simulation is complete and then fills in the results on the screen, according to the user's display specification. The user may specify a complete simulation run from a set of initial conditions or a simulation stepped run which continues from the last simulation's ending point. In the event of a complete simulation run, a new simulation results data structure is created and filled in. In the event of a stepped run, the simulator appends new simulation data to the end of the previously created simulation results data structure.

Simulators, by their nature, must maintain the last state (history) of every node for every enabled component in the schematic. However, this history is kept only for those signals requested. This is done to minimize the amount of data storage required. It is possible to request that the history be maintained for all nodes at the expense of some amount of additional memory (or disk space) required.

When the editor receives notification from the simulator that the simulation run is finished, it displays the simulation data on the screen according the specifications for the display areas that the user has requested. If it is a textual display area, then the last state of the node is written into the allocated display area. If it is a graphical (timing diagram) display area, then the history data is presented in the allocated display area in the form of a timing diagram. In either case, the user can step through the state data back from the end point to any previous point in the simulation from the beginning of the session.

The editor may also create, at the user's request, an area on the screen for the presentation of a state table. The user identifies the signals to be monitored and identifies the simulation conditions. The editor then draws a table on the screen and headings corresponding to the monitored signals' names, and requests a series of stepped simulations. After each step, the editor records the last state data into columns under the signal name headings, thus creating a state table of the type seen in component specifications.

The techniques described hereinabove for electronic system synthesis, graphical design of an electronic system, simulation and display are independent of the type of electronic system being designed and may be applied with equal facility to multi-board systems, board-level designs, ASICs, custom integrated circuits, portions of systems, or multi-chip modules.

According to an aspect of the invention, the techniques of electronic circuit synthesis and simultaneous graphical editing and display can be used in combination to provide a user with means for viewing a behavioral synthesis of an electronic system in progress, and to simulate the all or a portion of the electronic system and to view signals within the electronic system.

According to another aspect of the invention, design rule violations (e.g., timing violations detected during synthesis) flagged by the synthesis process can be presented to the user by display the portion of the electronic system involved in the violation in schematic diagram form, and presenting simulation results which illustrate the violation on the schematic diagram.

According to another aspect of the invention, an expert system can be used to analyze the electronic system and the design rule violation, and to suggest to the user possible alterations or corrections to the design of the electronic system which would eliminate or correct the design rule violation.

Other objects, features and advantages of the invention will become apparent in light of the following description thereof.

BRIEF DESCRIPTION OF THE DRAWINGS

FIGS. 1–7 are schematic representations of the methodology of the present invention.

FIG. 8 is a block diagram of a suite of exemplary software tools for implementing the methodology disclosed in FIGS. 1–7.

FIG. 9 is a block diagram of the methodology of the present invention.

FIG. 10 is a block diagram of the Analyzer portion of the present invention.

FIG. 11 is a block diagram showing the Analyzer

FIG. 12 is a block diagram of a generalized logic synthesis methodology, lacking critical features of the present invention.

FIGS. 13–15 are exemplary screen displays generated by a computer system employing the methodology of the present invention.

FIG. 16 is a block diagram of the ECAD system hardware of the present invention.

FIG. 17 is a software structure chart illustrating the major software components of the system of FIG. 16 and the data flow between them.

FIG. 18 shows a typical display screen image with text-based state data from simulation on the display device of FIG. 16.

FIG. 19 shows a typical display screen image with graphic-based timing data from simulation on the display device of FIG. 16.

FIG. 20a is a view of a representative multi-chip module.

FIG. 20b is a representative hierarchical view of the multi-chip module of FIG. 20a.

FIG. 21a is a view of a representative board-level system.

FIG. 21b is a representative hierarchical view of the board-level system of FIG. 21a.

FIG. 22 is an ECAD display screen representation showing simultaneous schematic display and simulation of the board-level system of FIGS. 21a and 21b.

FIG. 23a is a block diagram of a system for graphically displaying circuit diagrams and simulation results corresponding to a design rule violation detected in the synthesis of an electronic system.

FIG. 23b is a block diagram of a system similar to that of FIG. 23b, but incorporating an expert system for suggesting possible design alterations or corrections to the user.

DETAILED DESCRIPTION OF THE INVENTION

Introductory Comments

Figure 13:
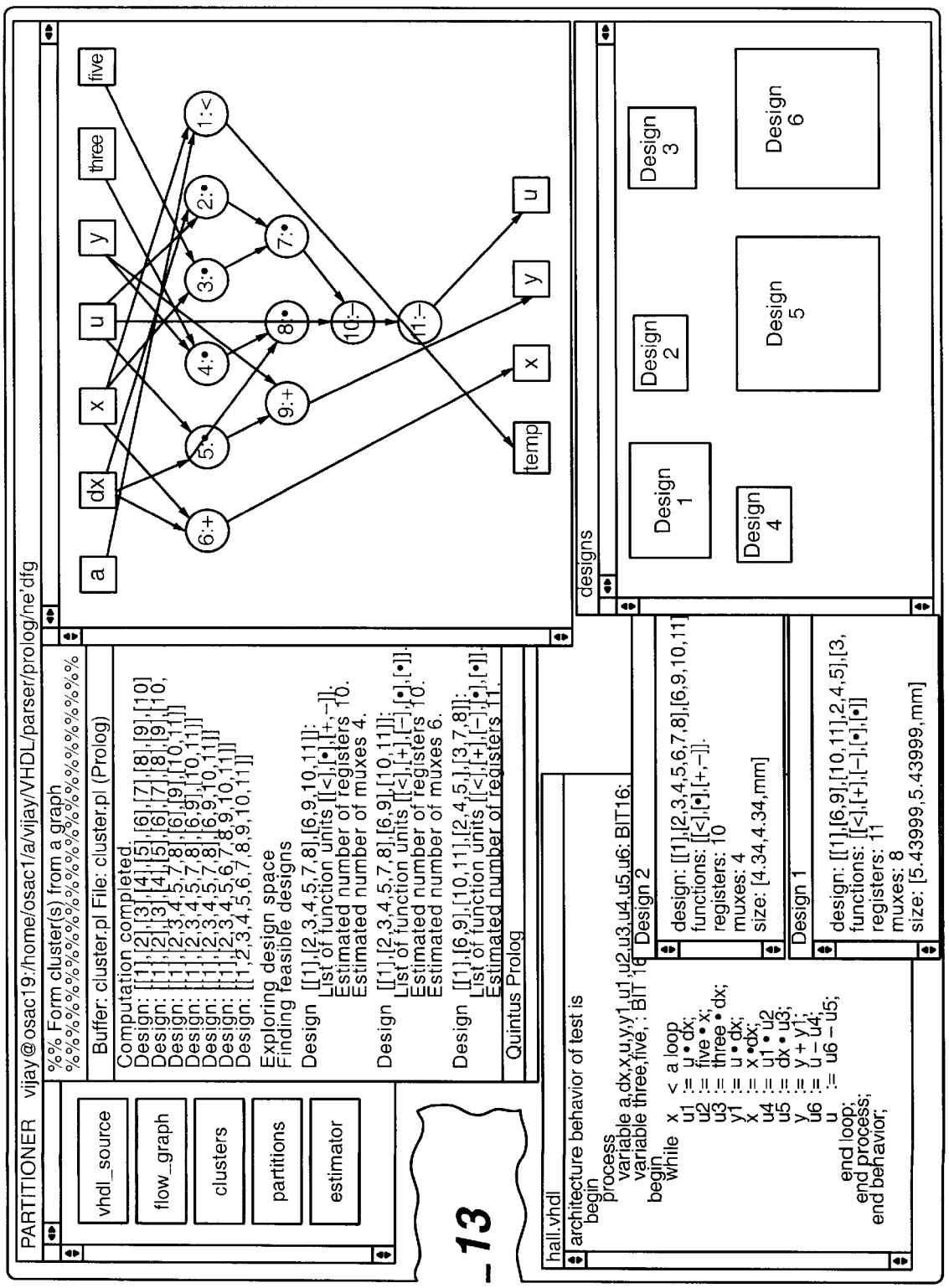

In modern digital systems, designs incorporating 70,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

In the prior art, the process of designing an electronic circuit on a typical ECAD (Electronic CAD) system is done in several discrete steps. A schematic diagram of the circuit is entered interactively through the use of a schematic editor which produces a digital representation of the circuit elements and their interconnections. The user of the ECAD system then prepares a list of input stimuli (vectors) representing real input values to be applied to the simulation model of the circuit. This representation is then compiled by a schematic compiler and translated into a form which is best suited to simulation. This new, translated representation of the circuit is then operated upon by a simulator, which produces numerical outputs analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for hierarchical design whereby a previously created and stored schematic may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, or the like.

FIG. 12

FIG. 12 shows a generalized design methodology 1210. It should be understood that the descriptions contained herein are in terms of a suite of software "blocks" that can be run on any suitable computer system (shown, for example, in FIG. 16).

A designer begins designing a circuit (or system) by formulating a behavioral description of a circuit's desired behavior in a high-level computer language, such as VHDL. This is represented in the block 1212, which shows exemplary high-level code describing a desired behavior.

Next, the designer re-formulates the design as a register-transfer level (RTL) description of the circuit in terms of pre-designed functional blocks, such as memories and registers. This is represented in the block 1214.

The resulting RTL description is simulated, in a block 1216, to ensure that it equates to the original behavioral description. At that point, the design consists of synthesizable parts (combinational logic, registers and flip-flops) and non-synthesizable parts (pre-designed blocks).

The logic is then minimized in a block 1218, by finding common terms that can be used repeatedly, and maps the description into a specific technology (e.g., CMOS) in a block 1220. Further, the non-synthesizable parts are compiled in a block 1222.

The foregoing steps 1212 through 1222 are all technology independent (except for the step 1222, to the extent that it is technology dependent).

The design of at least the synthesizable parts is optimized in a block 1224 to produce a gate-level net list 1226.

The blocks 1218 through 1222 represent a typical logic synthesis tool.

Strictly speaking, only the steps after the RTL description is produced constitute "logic synthesis", and such a bottom-up approach (re-formulating the behavioral description into a RTL description) tends to be flattened out and/or lose much of the intent of the original behavioral description, as well as being labor-intensive and error-prone.

According to the present invention, described below, "behavioral synthesis" will bridge the gap between a behavioral description and a RTL description to produce a valid gate-level net list automatically from a high-level behavioral description. In a sense, behavioral (e.g., VHDL) and RTL circuit descriptions can both be considered "high-level" descriptions, since they do not deal with gate-level representations. The distinction between a behavioral description and a RTL description is primarily in the amount of structure that they specify and in the "allocation" or definition of structural components that will be used in the resulting gate-level implementations. Behavioral descriptions do not address the issue of what specific structural components (e.g. memory, functional blocks, etc.) are to be used. In an RTL description, structural components are explicitly identified and there is a direct mapping between this description and the resulting gate-level implementation.

The ability to synthesize behavioral and RTL descriptions is significantly impacted by this difference in structural content. RTL synthesis ("low-level" synthesis) is a relatively well-studied, and much implemented, technology. The ability to synthesize an RTL description into a gate-level implementation is well established. The present invention discloses a methodology for mapping a behavioral description with little or no structural content into a RTL level description with significant structural content. This is largely, but not entirely, a top-down design methodology.

What is lacking in a strictly top-down design methodology is the use of detailed knowledge of lower level physical information of the modules (circuits, functional blocks, etc.) being designed. Typically, the decisions concerning the selection and placement of modules are deferred until the time the behavioral synthesis is complete and an RTL structure has been chosen for the implementation. The reason for this is that, typically, structural information is not available at the behavioral level, and hence the system is unable to employ criteria such as area and delays while exploring the design space. Details such as layout, module size and interconnect can have an enormous effect on the shape of the RTL design space.

As will become evident hereinafter, partitioning the design at a high level (behavioral description) into architectural blocks creates a "vehicle" for providing such structural information at the behavioral description level, thereby adding the ability to estimate lower-level physical parameters. Further, partitioning helps the designer explore other avenues such as operator level parallelism and process level concurrency in order to improve the design.

FIGS. 1–8

There follows an exemplary embodiment of the invention described in the context of an ASIC design.

FIG. 1

FIG. 1 is a simplistic view of an ASIC chip 110, covering gate arrays and standard cells, in the context of synthesis. In general, an ASIC chip consists or all or some of the different functional entities shown in the Figure. Moreover, the Figure describes means for synthesis/compilation and optimization of these blocks. Not shown in the Figure are the chip's I/O buffers and periphery. Although synthesis tools are not meant to manipulate I/O buffers, nevertheless their timing description in the optimization environment can be beneficial for optimization of the chip's core part.

The exemplary chip 110 includes the following major functional blocks: memory 112, data path 114, mega-cells and mega-functions 116 and functional units 118 which may include regular blocks 120 such as adders and decoders and random logic 122.

The memory block 112 is generated by memory compilers using efficient technology-dependent building blocks. The output of the memory compiler is a net list of primitive transistors.

The data path block 114 is generated by providing the behavioral description in an HDL (Hardware Definition Language) language. The data paths can be synthesized through general purpose synthesis programs or specialized data path compilers. The output of the synthesis programs/compilers is the structural description of the design using ASIC macro-cells.

The mega-cell and mega-function block 116 is chosen from pre-designed building block libraries, which are already designed for optimal performance.

The regular functional units 120 are generated using regular blocks such as adders, decoders and multiplexers. These blocks can be further optimized, if desired.

The random logic blocks 122 includes random logic, glue logic and the state controller. The description of these units is provided in Boolean equations, truth table, data flow and HDL description. This part of the chip is designed around the other parts. This functional unit is partitioned into smaller chunks of functional units, and the process is recursively repeated. The atomic features are still functional units that are readily functionally verifiable. A general purpose synthesis/optimization tool is used to create these functional units, and to optimize the units according to the specified constraints and those imposed by memory, regular blocks and data path sections.

FIGS. 2–5

FIGS. 2–5 describe a synthesis design methodology that is independent of any particular design style or technology. The various steps (blocks) of this methodology are represented by the circled numerals 1–18, and are as follows:

Step 1 is Design Specification. This consists of system (device) specification and may include functional specifications of subsystem elements, timing specifications and I/O requirements, and power, package and interface requirements.

Step 2 is Design Description. This is the functional description of the design and all its subsystem elements. The description is, ideally, given in a high level description language, such as VHDL. Depending on the nature of the design, the description can be entirely at the behavioral level, or it may be intertwined with an RTL description.

Step 3 is Partitioning. Given the behavioral description of the design, partitioning (the Partitioner) breaks the design into separate modules that will make the overall synthesis, analysis and verification tasks more manageable. In doing so, the Partitioner consults technology files (described hereinafter) containing packaging, I/o capabilities and other technology-dependent information to optimally partition the design. In addition to functionally partitioning the design, the Partitioner can help the designer (see FIGS. 13–15 showing representative screen displays of the CAE system) in choosing the optimal architecture that would optimize the design, e.g. in terms of area and speed.

Step 4 is Module Description. Three modules are shown, but there could be many more modules involved. This is the RTL description of the partitioned design, in terms of an HDL (hardware definition language) description. Each module is accompanied with a set of timing and area constraints, which are related only to that module's domain (they are not automatically derived from the design description).

Step 5 is Composition. Composition is the opposite of partitioning, and facilitates examination and verification of the partitioned design. The partitioned design is reconstructed in this step, the end product of which is an RTL description of the entire design.

Step 6 is Functional Verification (Behavioral). Verification at the behavioral level is performed at two stages— while the design is being developed, and after the partitioning step. The former is source code debugging where the high level description of the design is verified for correctness of the intended functionality. The latter is to verify the architectural decisions that were made during partitioning, and to examine their impact on the functionality and performance of the entire design.

It will be noticed, in the above description of the steps shown in FIG. 2, that various "loops" are formed. A high level loop consists of behavioral verification (step 6) to debug the design description (step 2). A lower level loop consists of behavioral verification (step 6) of the partitioned (step 3) and composed (step 5) design. The partitioning process is guided by user interaction, and is driven by physical implementation factors such as technology, packaging, I/O capability and other information about the proposed device which is developed based on experience with similar devices.

Step 7 is Module Description. This is the description of a functional entity that is produced by the Partitioner or developed independently by the designer. This is preferably given in one of the following formats: HDL, truth table, equations or net list. As used in this example, a "module" is a functional block with a complexity of less than 3000 cells (it is not a chip with I/O pads).

Step 8 is Synthesis. Given the module description (step 7) and a target technology library, the design is mapped into the target technology. The synthesis process usually includes some form of logic optimization. This is the task of manipulating the logic expressions that define the functionality of the module (device). Minimization is done by removing redundancies, and adding or removing intermediate levels of logic (e.g., re-structuring of Boolean expressions).

Step 9 is Structural Description. This is the gate-level, technology-dependent description of the module produced by the synthesis tool. It is usually given in the form of a net list, from which a device can be automatically physically created.

Step 10 is Functional Verification (Structural). This is done to verify the correctness of the module against the intended functionality. This is only required if functional verification at the behavioral level (step 6) has not been performed. One assumes that the circuit generated by the synthesis tool complies (functionally) with the given module description. In case of discrepancies, the module description needs to be modified (debugged) at the top level, i.e. Design Description (step 2). This is necessary in order to preserve the integrity of the design and all of its subsystem elements.

Step 11 deals with Timing/Area Constraints. These are used to customize the optimization process. Optimization is usually driven by area and speed (timing) constraints. These might instruct the tool to perform rudimentary area versus speed trade off on individual or small clusters of gates, or to perform comprehensive area and speed optimization in combination with other constraints such as drive capability. A rich set of constraint constructs is required for meaningful design optimization, and are provided in the methodology of this invention. Timing constraints may include the following: maximum and minimum rise/fall delay, set-up and hold check, length of clock cycle and maximum transition time per net. The timing constraints may also include boundary conditions, such as signal skew at the module's inputs, drive capabilities of the modules outputs, etc., when such data is available.

Step 12 is Optimization. Given the design constraints and the module's structural description, the optimization process tries to modify the module so that its area and timing characteristics comply with the specified constraints. Depending on the nature of the design and the strength of the constraints, some or all optimization goals will be achieved. When no boundary conditions are available, optimization may be general purpose, aimed at minimization of the overall module. With boundary conditions, the objective is to optimize each module so that the overall higher level module complies with the specified timing requirements.

Step (block) 13 represents generating the Structural Description of the module after the optimization process.

Step 14 is Timing Verification and Analysis. This is a process of examining the effects of the optimization process (step 12), and examining its global impact. Tools such as static timing analyzers and gate level simulators would be employed. If the optimized module (step 13) does not meet all of the timing and area requirements, further trade-offs have to be made at this point. The constraints are then modified to reflect these trade-offs, and the optimization process (step 12) is repeated.

Step 15 represents a high level module, derived from the module's optimized Structural Description (step 13). A high level module consists of one or more sub-modules. Each sub-module has been optimized in its own domain. The high level module describes the interaction and connectivity between the sub-modules. When hierarchically applied, the target device itself is considered to be a high level module.

Step 16 is Timing Simulation, Verification and Analysis. At this stage, the optimized modules are composed (see step 5) together and implement the intended functionality of the high level module, or target device. Here, analysis includes logic level simulation, static timing analysis, electrical rule checking, etc. For more accurate analysis, it might be necessary to use a floor-planner or placement and routing programs to estimate wire delays. The wire delays are then back annotated into the design database prior to simulation. If the overall timing characteristics of the modules do not meet the specified requirement, a the timing constraints of the sub-modules are modified and optimization is performed.

Step 17 is Delay Back Annotation (DBA), which is optional. The inter-block wire delays can be more accurately estimated only after floor-planning of the sub-modules. More accurate intra-block and inter-block delays are determined after the placement and routing stage. Using these tools, the wire delays can be estimated more accurately. The delays can be back annotated to be used by the gate level Optimizer (step 12).

Step 18 represents introducing Global Constraints. Using the results of the analysis performed, the sub-modules' timing/area constraints are modified to reflect the global timing requirements. Sub-modules with new constraints are then re-optimized.

FIG. 6

FIG. 6 illustrates the usage of exemplary synthesis and optimization tools, and the abstraction level for the exchange of design data between these tools and a Design Compiler. Each tool addresses the synthesis or compilation of one or more of the major functional blocks of an exemplary ASIC chip 600. The usage of these tools and their interaction with the Design Compiler are of particular interest.

A Memory Compiler (MemComp) 602 takes the high level specification for memory mega-cells and produces logic and layout files for the purpose of simulation, testing and layout. The objective is to provide the Design Compiler (Optimizer) 604 with an accurate timing description of and drive capability information for the memory block. MemComp synthesizes high density or low power RAM or ROM blocks 606. As will become evident, the surrounding logic is optimized with respect to the memory block. The memory block created by MemComp 602 is provided in the same format as the internal macro-cells, i.e. a net list of primitive transistors, which cannot be read directly by the Design Compiler 604. Therefore, one of two possible intermediate steps is required: 1) (not shown) the data sheet generated by MemComp is used to manually extract the timing description of the memory block. This basically involves defining a set of "set_load", "set_drive" and "set_arrival" constraints and associating them with the relevant pins of the surrounding logic at the start of the optimization process; or 2) a Memory Modeler (see FIG. 8) is used to generate a model 603 in Synopsys Library Language (SLL; available from LSI Logic Corporation). The Memory Modeler reads the memory description and generates a complete timing description of the memory block. This contains all of the setup and hold values and the timing arcs and I/O pin characteristics. This task is similar to that of the Synthesis Library Model (SLM; available from LSI Logic Corporation) generator.

Mega-cells and mega-functions 608 are treated as basic building blocks, similar to the macro-cells in the synthesis library. Both are generally developed beforehand for optimal performance, so no optimization is required on these blocks. They are presented to the Design Compiler 604 simply to provide timing information so that the surrounding blocks can be optimized. The mega-cells are modeled in the same manner as the macro-cells, i.e. by using the Synopsis (SLL) library format. The mega-functions are ported into the Design Compiler in Synopsys DataBase (SDB) format. (The netlist back plane 610 is used as the primary design representation medium). Generally, the mega-functions model industry-standard functions, thereby providing the designer with a set of popular and proven standard building blocks. In the case of certain, highly-specialized, user-defined mega-functions, it would be necessary to ensure appropriate capability in the Design Compiler.

Random logic 612, in other words the remaining modules that ere not synthesized using the previously described tools and libraries, are synthesized by a general purpose logic synthesis tool 614 that optimizes the design for speed and area. It accepts hierarchical combinational and sequential design descriptions in equation, truth table, net list and/or VHDL formats. The optimization process is directed by specifying the "goals". Goals are represented as timing constraints. The optimization process makes trade-off evaluations and produces the best possible gate level implementation of the design for the specified constraints.

Since the Design Compiler 604 provides an environment for synthesis and constraint-driven optimization, it can be used as the overall synthesizer/optimizer. Blocks created by other tools can be loaded into the Design Compiler, where the timing information from these blocks can be used to synthesize and optimize the surrounding logic. For example, knowing the drive capabilities and the skews of the memory blocks' outputs would allow for accurate optimization of the glue logic.

Once the memory blocks are synthesized, and the appropriate mega-cells and mega-functions are chosen, the remainder of the design can be synthesized by the Design Compiler. Optimization is then performed according to user-defined timing constraints (see User Interface; FIG. 8) and those dictated by existing blocks. This is an iterative process. Constraints need to be refined until the desired timing and area requirements are achieved.

FIG. 7

FIG. 7 shows a synthesis design framework. The objectives of the disclosed framework are: to provide a unified front end for a set of synthesis and optimization tools; to provide an integrated synthesis environment by incorporating specialized synthesis tools with the Design Compiler, which is the main synthesis and optimization tool; to provide the capability of constraints-driven gate-level optimization of both sequential and combinational designs; to provide back annotation of wire delays from the Modular Design Environment (MDE; available from LSI Logic Corporation, described hereinafter) to the Design Compiler to make the necessary timing/area trade-off evaluations based on more accurate wiring delays; to provide a window-based graphical interface between the synthesis tools and the MDE module to control the data flow between the Design Compiler, the other synthesis tools and the MDE; to provide VHDL debugging, and analysis capability to front-end synthesis from VHDL; and to provide VHDL pre-synthesis partitioning capability to front-end synthesis form VHDL.

Generally, the design framework illustrated in FIG. 7 follows from the design methodology described hereinbefore. The methodology includes the following important steps:

partitioning the design into memory blocks, mega-functions, mega-cells and random logic;

using a layout tool, such as LSI's ChipSizer (see FIG. 8), to obtain the required die size, which is a function of the area, the number of pins and pads and other factors;

choosing the mega-cells and mega-functions to be used, and characterizing the cells for the Design Compiler;

generating memory blocks, and characterizing them for the Design Compiler;

partitioning the random logic into smaller functional units;

using the Design Compiler to synthesize the remaining blocks, in a "bottom-up" manner, starting with the lower level functional units, including: verifying the functionality of the block using functional verification tools or simulators; optimizing the design for area or, in general terms, for timing of some or all of the selected paths; composing the higher level functional blocks and, when a functional block interfaces with an existing building block (e.g. memory, mega-cells, mega-functions), optimizing the functional unit (and all or some of its lower level units) according to the timing/area constraints 702 imposed by the building block; and repeating these steps until all of the functional units are synthesized into a structural description 704. The resulting structural description 704 may be back annotated 706 as a structural description 708 (of timing/area constraints) to the Design Compiler. In the loop shown:

for larger functional blocks, a floor planner 710 is used for placements and more accurate wire delay prediction 712 and, with this information, using the more accurate block size provided by the floor planner to re-estimate the internal wire delays of the lower level functional units and back-annotating these delays into the Design Compiler to provide more meaningful internal timing optimization, and/or using the wire delays of the inter-block buses and wires to derive the appropriate boundary constraints for timing optimization, i.e. to specify inter-block delays through constraint constructs; and incorporating the timing delays and drive capabilities of I/O buffers into the timing constraints. (The I/O buffers should be selected as early in the design cycle as possible.)

FIG. 8

FIG. 8 provides an overview of the design framework, illustrating an exemplary suite of tools, many of which are commercially available (as individual units), for implementing the methodology of the present invention. Herein it is important to note that the methodology of the present invention augments many discrete software tools, such as those described herein, and provides enormously increased functionality in the context of behavioral synthesis, which otherwise would not be available by simply combining these tools.

The design framework, hereinafter termed the Co-Design Environment (CDE; trademark of LSI Logic Corporation) 800 is divided into two sections: on-line design tools and off-line design tools. The on-line design tools are programs that are utilized directly or indirectly by the user during the design process, and are relatively generalized to handle a variety of design objectives. The off-line design tools are programs that generate libraries and models of the various building blocks for the Design Compiler, and may be very user-specific.

A first group 802 of on-line tools, labeled CDE/SY, constitutes the dynamic part of the Co-Design Environment and includes the following:

A Design Compiler Interface 804 (shown in two parts) controls the data flow and interactions between the MDE and the Design Compiler 604. It enables the user to follow the process of the design from one environment to the other, and interacts with the MDE programs via script shells and a command line. Interactions with the Design Compiler are achieved through the dc-shell script and constraints files.

A Graphical User Interface (Graphical UI) 806 facilitates user interaction with the CDE by: abstracting out those steps of the design flow that do not require the designer's intervention, assisting and guiding the designer through the various stages of the design process as outlined by the synthesis framework, and assisting the designer in the composition of the constraints file for optimization.

A Block Level Delay Estimator 808 provides the optimization tool with pessimistic wire delays which, in turn, causes the optimizer to compensate by placing buffers in and around the block or to use high power gates all over the design, and is especially applicable to small functional blocks. An advantage of using the Block Level Delay Estimator is that in pre-place and pre-layout stages of the design, both the synthesis and the analysis tools consider the wire delays to be a function of fan-out only. Although this might be a good estimate for the purposes of analysis, it has some undesirable side effects on the optimization process. Usually, in the present methodology, optimization is performed on a functional block of less than a few thousand gates, but most existing wire delay algorithms (based on fan-out) are geared towards much larger, die-sized blocks. Hence the Block Level Delay Estimator provides more realistic estimates of wire delays for the block size being manipulated through the system, and provides appropriate tables (wire_loading) to be used by the Design Compiler.

A Memory Modeler 810 reads the net list of a memory block created by MemComp (See 602, FIG. 6), and generates a timing model (in SLL) to be used by the Design Compiler. The objective is to provide the Design Compiler with accurate timing information about the memory block. This will help the optimization process as the drive capabilities, the capacitive loads, and the setup and hold time of the memory I/O will automatically define some of the constraints for the surrounding logic.

A Delay Back Annotator (DBA) 812 comes into play after the floor planning stage, and provides more accurate wire delays into the optimization database. The DBA is used for two distinct purposes: 1) to back annotate wire delays for a block that is going to be re-optimized, using the latest (and most valid) delay values; and 2) to back annotate wire delays for a block that has been optimized and has met the design constraints, thereby providing the latest delay values for accurate modeling of the block so that surrounding blocks can better be optimized.

A VHDL Analyzer 814 provides source code (VHDL) debugging and assists in functional verification of the VHDL description. The VHDL Analyzer is discussed in greater detail in FIGS. 10 and 11, and in the annexed code listing.

A VHDL Pre-Synthesis Partitioner 816 partitions behavioral descriptions (VHDL code) into RTL descriptions of modules and sub-modules. During partitioning, appropriate architectural decisions are based on time/area analysis.

The off-line part of the CDE is a collection of libraries 818, which are either in SLL (Synopsis Library Language) or SDB (Synopsys Data Base) format. SLL is a dedicated language for modelling of cells or modules, and is most suitable for synthesis and timing (static) analysis. SDB (available from LSI Logic corporation) is the Design Compiler's database, and can contain a design description in a multitude of formats, including Boolean expressions, truth tables and net lists.

A Macro-Cell Model Generator 820 reads the structural description of the macro-cells from the MDE libraries and generates the appropriate models in SLL. The behavior of sequential cells may be modeled by the Model Generator, subsequently to be manipulated by the Design Compiler.

An I/O Buffer Model Generator 822 provides timing and drive capability information on the I/O buffers, which are modeled as ordinary macro-cells in the CDE environment. Data derived therefrom is used for optimization of the logic inside the chip. The Optimizer (Design Compiler 604) is not expected to manipulate the I/O buffers. This Model Generator is capable of handling configurable buffers, which are modelled as "n" cells, where "n" is the number of all the possible configurations of that buffer.

A Mega-Cell Model Generator 824 is similar to the Memory Modeler in the on-line portion of the CDE in that the objectives are generally the same. However, as mega-cells are static and do not change from one design to the other, this modelling can be performed in advance to create a synthesis mega-cell library.

Mega-Functions Support 826 provide the Design Compiler with timing information about the mega-functions. This helps the optimization process, since the drive capabilities, capacitive loads, and path delays of the mega-functions will define some constraints for the surrounding logic. Mega-functions are essentially "black boxes" from the user's point of view. Therefore, the Design Compiler is configured to prevent users from viewing or altering the mega-functions.

The various functions of the Design Compiler are shown in the block 604, and a VHDL Simulator (for behavioral and structural verification, discussed hereinbefore) is shown at 828.

Illustrative tools (ChipSizer, Memcomp, LCMP, LLINK, LVER, LDEL, LCAP, LSIM, LBOND and LPACE), commercially available within LSI Logic's Modular Design Environment 830 are shown. Generally, these tools consist of a set of programs that compile, link, simulate and verify digital logic at the chip (structural) level. Any number of other, commercially available programs could be employed at this level to perform similar functions.

FIG. 9

FIG. 9 shows a more generalized arrangement of the methodology of the present invention, in such terms that one skilled in the art to which the invention most nearly pertains could readily implement the methodology.

At the conceptual level, a behavioral description 902 of the target device is formulated in a high-level language, such as VHDL. The behavioral description is compiled and simulated 904 using test vectors 906 to verify the design description. The behaviorally-verified design is partitioned 908 into suitable architectural blocks, as described above. Partitioning allows for the critical link 910 to the physical implementation of the target device, incorporating critical size (area) constraints (i.e. floor planning) and critical timing (speed) information (i.e. back annotation).

At the structural level, the partitioned design is provided to logic synthesis tools 912 which formulate both structured and unstructured logic (functional blocks). Additional information regarding the functional blocks is derived from libraries 914. Importantly, the timing/area constraints introduced through the partitioner 908 are embedded at the logic synthesis stage. The output of the logic synthesizer 912 is a net list 916 for the target device, such as in VHDL, which is compiled and re-simulated 918 (904), using the test vectors 906 and pre-defined information about blocks contained in the libraries 914. If necessary, updated timing/area constraints are provided back through the partitioner 908 and the target device is re-synthesized 912 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list has been described, the structural description of the target device is provided to a suitable silicon compiler (Physical Implementation System) 920, such as LSI Logic's MDE, to create a working device 922. At this stage, the tools required are technology (silicon) dependent.

FIGS. 10–11

FIGS. 10 and 11 illustrate a hierarchical knowledge base approach to simulate hardware descriptions in a high-level Hardware Description Language (HDL). In this approach, a knowledge base is constructed corresponding to each functional block of the hardware description. The hierarchical relationships among the various blocks in the description is mapped on to the knowledge base corresponding to those blocks. The hierarchical knowledge base thus formed is used for simulating the hardware description. Unlike previous approaches to simulation and verification of digital circuits (devices) described in a HDL, there is no need for intermediate translation steps.

In the past, artificial intelligence techniques have been used in formal verification and hybrid simulation of digital hardware to address the problem of combinatorial explosion of exhaustive logic simulation. In one approach, structural and behavioral descriptions of a design are first translated into first order clauses in Prolog. This set of clauses asserted in a Prolog data base can be viewed as a "flat" knowledge base. The hierarchy in the design is enforced implicitly by suitable relationships among the assertions in the knowledge base. A theorem prover is then used to establish the equivalence between the structural specification and the behavioral description to formally verify the design as represented by the data base. This approach has the disadvantages of translating a HDL description of a design into first order clauses and maintaining a large knowledge base which is difficult to manage for complex, hierarchical systems. In another approach, hybrid simulation is used to verify digital designs the design is described as an interconnection of functional modules in a first order language, such as Prolog. The design may be hierarchical with the lowest level being Boolean gates. It is then simulated with both numerical and symbolic input signal values. This, again, has the drawback of having to maintain a large Prolog description for complex hierarchical designs.

The present methodology differs from the previous approaches by not having to go through intermediate translation steps, and not having to maintain a Prolog description of the design. Generally there are three steps in the present methodology:

Analysis, wherein the input description is analyzed for syntactic and semantic correctness, and a parse tree is formed. Each node in the parse tree is associated with a semantic rule.

Construction of the hierarchical knowledge base, wherein the semantic rules associated with nodes of the parse tree are used to construct a knowledge base for each block of the description, and the hierarchical relationships among the knowledge bases are derived from the semantic rules. The knowledge bases contain simple assertions and methods to compute functions and procedures present in the source description. The also make up the basis for other design tools.

Simulation, wherein using these simple assertions and computation methods contained in the knowledge bases, the output signal values are calculated for a given set of input signal values. The input stimulus can be either symbolic expressions or numerical values.

FIG. 10 shows the steps in simulating a design description.

Beginning with a design description 1002 written in a formal, high-level language, the description is analyzed (parsed) 1004 using, for instance, definite clause translation grammars (DCTG) to form a parse tree 1006. In the parse tree, semantic rules are attached to each node. Each syntactic rule for the formal (high-level) language is associated with one or more semantic rules. Preferably, two semantic rules are associated with each syntactic rule—one of the semantic rules is used to verify the semantic description of the description, and the other semantic rule is used to simulate the description. Each rule has a semantic and a syntactic part. The semantic part has two attributes, namely, "check_semantics" and "execute". The semantic rules specify how these attributes are computed and verified. Using this technique, it is not necessary to go through intermediate translation steps to analyze and execute a description. Rather, the methods of analysis and execution are specified in conjunction with the syntactic rules of the language.

After a successful parse of the given description, each node in the parse tree thus formed is associated with the attributes as specified in the DCTG rules of the language. The computation of an attribute attached to a node can be a recursive transversal of sub-trees associated with the node. For semantic analysis, one semantic attribute verifies whether any semantics of the language is violated, and error messages (see FIG. 11; 1012) would be generated. These violations include redefinition of objects within the same scope and incorrect argument types to a procedure. Only a correct description is passed on to the hierarchical knowledge base 1008. Thus the analysis of the description ensures that it conforms to the syntax and semantics of the HDL description, and leads to the construction of a valid hierarchical knowledge base. Further discussion of design rule violations can be found in the descriptions of FIGS. 23a and 23b, hereinbelow.

The hierarchy in a design description can be of two kinds. One is imposed by the structural design description in which a design entity (component, process, function, architecture, configuration) is composed of several other design entities. The second relates to scoping and visibility rules of the language. The knowledge base 1008 is formed, i.e. one knowledge base for each design entity, after the syntax and semantic analysis of the input HDL description. Each knowledge base has a set of unit clauses which correspond to all the static declarations, default values of signals, variables and the data structures necessary for simulation corresponding to the design entity. The hierarchical relationships among the knowledge bases are automatically derived while analyzing the design description using the DCTG rules of the HDL. This corresponds to a direct mapping of the hierarchy in the hardware design description. The need for a hierarchical knowledge base also arises due to the scope and visibility rules of a formal language that is being analyzed. The scoping and visibility rules are also used to determine the relationships among the design entity knowledge bases. The hierarchical knowledge base 1008 makes up a simulable model of the design. Other design tools such as synthesis and partitioning tools (discussed hereinbefore) also use the knowledge bases for extracting design information.

In the past, because of the scope and visibility of the rules of a formal language, in both translation and compilation, every identifier is given a unique names. However, in the case of simulation, when the description is being executed directly, this technique is not feasible.

The description contained in the knowledge base may contain different levels of abstraction of hardware design, namely, behavioral, RTL and gate level descriptions. Simulation involves execution of all the functions, procedures and processes for generating transactions on the drivers. A driver is associated with every signal that appears in a signal assignment statement and is represented by a sequence of transactions (each transaction is a value/time pair). Generating transactions, ordering them according to certain constraints, and scheduling them at a certain time is the key to simulation. The input test vectors for simulation are asserted in the knowledge base corresponding to the design entity in which the input signal appears. The test vectors can be either symbolic expressions or numerical values. The DCTG rules are again applied to the simulation data structures stored in the knowledge bases, and a second semantic attribute ("execute") is computed, this set of semantic rules constitutes the simulation engine. It includes computation of values of arithmetic expressions, Boolean expressions, symbolic expressions, time expressions execution of sequential and concurrent statements, and generation of transactions. The computation is ordered by the simulation semantics of the language in conjunction with the hierarchical relationships. After generating transactions for all drivers, they are ordered with regard to time, synchronicity and simultaneity. As simulation time advances, the drivers update the values of the associated signals. This causes events to occur on the signals which may cause certain processes to "wake up" and in turn lead to the occurrence of more events. The next step is to schedule the events on the signals. This is handled by a scheduler which looks at the event ordering and generates unit clauses related to the time, signal and value of a scheduled event. The final step is to assign the value to the signal at the appropriate time.

It may happen that there could be multiple drivers due to multiple signal assignments in the source description. For the same signal, multiple drivers might try to assign values at the same time. In such a case, the value is resolved by a resolution function associated with the signal, and the resolved value is assigned to the signal. This leads to unit clauses which give the final resolved values of every signal present in the design description, in the simulation results 1010.

FIG. 11 is an overview of the types of rules, described above, for defining the correct relationship between objects in the constructed knowledge bases, for converging to correct structural representations of behaviorally-specified designs, and for enforcing a "good" style of VHDL code leading to the correct structural representations.

Prolog provides a useful tool for implementing the described methodology. Prolog grammars such as DCTG are useful in associating semantic rules with syntactic rules of the hardware description language (e.g. VHDL), and the inference engine contained in Prolog makes it straightforward to handle derivation of the inter-relationships between the different entities in the knowledge base.

The hierarchical knowledge base, described above, helps maintain the hierarchical nature of large hardware designs and permits large hardware descriptions to be directly simulated without having to go through intermediate translation steps. The knowledge base can be used by other tools, such as those set forth above.

An executable listing of the Analyzer/Interpreter, as described with respect to FIGS. 10 and 11, is included in the parent case Ser. No. 07/507,201, and is incorporated by reference herein.

FIGS. 13–15

FIGS. 13 through 15 show representative screen displays of the methodology of the present invention, as they would be presented to the user. In the main, the display of FIG. 13 is discussed.

In the lower left "window" of the display of FIG. 13 is shown a VHDL description of a counter ("while x<a loop . . . "), created by the user. The user then simulates the code, at the high-level, to ensure that it the description is correct, by providing operands ("variables").

The system then creates "data flow", relating to the sequencing of operations and the parallel or serial configuration of functional blocks required to realize the counter, and presents the results to the user in graphical and/or textual form. In this example, seven design alternatives are displayed in the upper left window ("Design: [[1] . . . "). One of these design alternatives, selected by the user for viewing, is displayed in the upper right window (as interconnected circle and square primitives) In the lower right window is displayed the estimated area that would be required to implement the design, and is technology dependent. Also displayed in the upper left window are estimates of functional units (registers, muxes) that would be consumed by the various design alternatives. This all relates to exploring the design space, and allows the user to perform a "what if" analysis for choosing a preferred design in terms of size, speed, performance, technology and power. (In the upper left window of FIG. 15 are shown size estimates for particular functional blocks labelled "8.1", "11.1", etc.) All of the above is performed prior to any synthesis, to allow the user to make intelligent trade-offs leading to a viable design, by interacting at the architectural level.

By partitioning, accurate timing estimates can be derived as discussed hereinbefore (not shown in the screen displays).

Summarizing the above, a methodology is described for the implementation of complex digital systems. The methodology includes:

a) a mechanism for semantic capture of the specification and description of the digital hardware for which an implementation is desired;

b) hardware descriptions embodied in a specification language, such as VHDL (or VHDL Intermediate Format), having well standardized semantics;

c) utilization of an appropriate software language, such as Extended Definite Clause Grammar (EDCG) and Prolog, for formal capture of the semantics of b);

d) direct execution of the semantics and of the behavior of the hardware described in a) and b);

e) execution of the intent contained in the description of a) without a translation step, such as with Prolog and its predicate logic formalism (knowledge representation of the digital hardware is achieved via the imbedding provided by predicate logic, semantic description of EDCG, Prolog and the VHDL language);

f) system level partitioning for creating optimized versions of hardware functional blocks for trade-off display, predicting for estimating hardware resources (sizes), speed and power, and mapping from one level of design representation to another;

g) isomorphism among various levels of partitioned hardware (across semantics, structure, behavior, logic and functions);

h) synthesis of hardware directly from semantics and intent contained in a) through f) into low level structural logic descriptions;

i) methodology for closure between the timing goals of a) through g); and j) methods for displaying knowledge in a), d), e) and f).

One skilled in the art to which the present invention most nearly pertains will readily be able to implement the invention based on the description set forth above. The above-described embodiment is set forth in terms of exemplary, well known logic synthesis tools, especially for deriving the structural representation and physical implementation from the RTL description of the device being designed. Other implementations would largely be driven by the particular technologies and logic synthesis tools that may be employed.

Appended to parent case Ser. No. 07/507,201, and incorporated by reference herein, are code listings of the Partitioner program (441 pages), the Synthesis Controller program ("SYN CONTROLR") which is a background program that processes the functional calls from the VHDL description of blocks (see FIG. 6) to memory blocks, mega-cells, mega-functions and other arithmetic unit functions in MDE and replaces these blocks by a component that can be simulated and merged (443 pages), and the "LIVE" (LSI Intelligent VHDL Environment) program, which is the Analyzer referred to hereinbefore (178 pages). These are all in executable code converted into hex through a standard UNIX utility.

At any point in the logic synthesis process discussed hereinabove, the system can be represented as a number of interconnected functional blocks. At early stages of the process, some or all of the interconnected blocks may be described in terms of behavioral or functional characteristics, rather than detailed circuit elements. At later stages of the process, however, very detailed low-level circuit descriptions of these blocks (i.e., comprising logic gates, transistors, etc.) are available. Regardless of the degree of completion of the logic synthesis process, the system can always be represented as a schematic diagram comprising a number of interconnected blocks. The blocks can be simulated, either functionally, logically, or behaviorally to provide simulation results representing signals on the interconnections between the blocks (i.e., the "pins" of the blocks. Some of the blocks may have lower-lever hierarchical descriptions, or even complete circuit-level descriptions, in which case it is possible to traverse the hierarchy to "see" down to lower levels of the block. As the synthesis process continues, greater detail becomes available. It is highly desirable, at various points in the design process, to do a "sanity check" by simulating all or part of the system being designed.

The discussion hereinabove with respect to FIGS. 1–15 is directed mostly to synthesis of lower-level logic functions from high level functional and/or behavioral descriptions thereof. Attention is now directed to issues relating to interactive graphical simulation of the synthesized logic systems and larger systems into which the synthesized systems are subsumed.

FIG. 16 shows an ECAD system 1600 comprising: a computer processor 1602 with mass storage devices 1604, a graphical display device 1606, a keyboard 1608, a pointing device 1610, a graphical output device 1612, and a simulation accelerator, 1614. The pointing device 1610 may be a mouse, digitizing tablet, trackball, joystick, or any other similar cursor positioning device. The graphical output device 112 is intended for hard copy output of schematic diagrams and for the printing of layout artwork.

With respect to FIG. 17, there is resident within the ECAD system (1600 of FIG. 16) a software system 1700 comprising a number of data structures and programs. Upon initial startup, a schematic editor 1710 reads in a series of initialization parameters 1702 which set default mode selections and various configuration parameters. Said schematic editor may be the LSED editor by LSI Logic Corp., with modifications which will be described later. The schematic editor 1710 accepts input from a schematic source file 1704, and displays its graphical representation on the ECAD systems's graphical display screen (1706 with respect to FIG. 16). If there is no schematic source file, it is assumed that a new schematic is being entered, and a blank entry sheet is presented on the display screen and a new, blank schematic source file 1704 is created. The schematic editor operates according to commands coming from user inputs 1708. Every command entered is recorded in a session log file 1706 such that the editor may undo any number of commands entered by the user. Some commands from the user inputs 1708 will be requests to place and interconnect schematic symbols on the display screen. To accomplish this, the schematic editor looks up the requested component(s) in a component database 1712 and retrieves graphical symbol representations of the requested component(s) contained therein. As the user enters the schematic diagram on the screen, the schematic editor creates a net list and invokes the function of a logic compiler 1716.

One of ordinary skill in the art to which this invention most nearly pertains will understand that modifications to the current LSED (or similar) editor may readily (in light of the clear and concise descriptions contained herein) be implemented in additional software code suitable to the particular software system being modified, and should include:

1. Extensions to the net-list output structures to include status indicators on each component and net indicating "activated" or "deactivated" and "eligible for simulation" or "ineligible for simulation".

2. Extensions to the user command set to enable the user to simulation data values by pointing to nodes or nets and specifying data values and conditions. These data values and conditions will be stored in a data structure (1718 with respect to FIG. 17) as pre-defined stimuli. Said data values and conditions may be the same data values and conditions already accepted by the LSIM simulator, produced by LSI Logic Corp.

3. Extensions to the user command set to enable the user to request simulator functions. The set of simulator functions will be those already accepted by LSI Logic Corporations LSIM simulator.

4. Extensions to the LSED editor function to permit it to signal (in software) the logic compiler and logic simulator to begin operation.

5. Extensions to the LSED editor function to permit it to detect when requested simulator and/or compiler operations have been completed and to detect status information returned by those programs (such as: specified simulation conditions met/not met, etc.).

6. Extensions to the user command set to enable the user to identify small display areas adjacent to schematic notes and/or nets for the display of simulation data relating to such nodes or nets. The internal representations of such display areas will contain indications of the type of display requested: textual state data or graphical timing data.

7. Extensions to the user command set such that a display area or display areas may be set aside for the display of state table information. Such commands will require that the user identify the signals to be included in the state table, provide stepping conditions for the simulator, optionally provide initial conditions for the first simulation run (through the mechanism of LSED editor modification number 2 above), and the number of steps to perform or some special ending conditions (through the mechanism of LSED editor modification number 3 above).

8. Extensions to the LSED editor function to permit iterative calls to the simulator according to user specifications (entered by the mechanism of LSED editor modification number 7 above), to wait each time the simulator is invoked until the requested operation is completed, and to read the simulator state information contained in the simulation results file (1730 with respect to FIG. 17) and retrieve the state data corresponding to the user specified values to be entered into a state table or state tables and format it for display in columns under the corresponding signal name heading in the state table, each time advancing one line. After "n" iterations, there will be "n" lines of state information displayed in the state table.

9. Extensions to the LSED editor function to permit it to retrieve state information from the simulation results file (1718 with respect to FIG. 17), to identify it by node or net name, and to format it for display as a textual logic state in its corresponding pre-allocated display area marked for textual state display (set up by the user through the mechanism of LSED editor modification number 6 above).

10. Extensions to the LSED editor function to permit it to retrieve state history information for the simulation results file (1718 with respect to FIG. 17), to identify it by node or net name, and to format it for display as a graphical timing diagram in its corresponding pre-allocated display area marked for graphical timing display (set up by the user through the mechanism of LSED editor modification number 6 above).

11. Extensions to the LSED editor to permit it to store the interactive state data for viewing at another time, create macros to move through the interactive simulation in defined steps or to cycle a clock, pop up existing or user-defined data sheets on any library element being used.

Again, with respect to FIG. 17, the logic compiler 1716 may be the LCMP compiler produced by LSI Logic Corp., with modifications described below. Using the information in the schematic net-list 1714 and the component data in the component database 1712, the logic compiler creates a schematic object file or files, the structure(s) of which is(are) optimized for simulation, verification and layout (respectively). Said modifications to the LCMP compiler are made such that the compiler will accept its command stream from the schematic editor 1710 rather than directly from user inputs. The LCMP compiler is also modified such that it will provide notification to the schematic editor that it has completed its operation. The LCMP compiler is further modified so that it will read parameters in the net-list identifying components and nets which have been de-activated. In response to a "deactivated" component or net, the compiler will simply skip over that component or net, effectively ignoring it and removing it (temporarily)

from the design until it is again marked as "activated". Further modifications may be made to the compiler so that it will operate only on data in the schematic net list which has changed since the last compilation (incremental compilation), thus providing significantly reduced compile times, which, while desirable, is not strictly necessary for function.

Again, with respect to FIG. 17, a logic simulator 1724 operates on the schematic object file 1720 and component simulation performance contained in the component database 1712 according to a set of initial conditions and/or signal conditions specified as pre-defined stimuli 1718. For standalone operations, simulator 1724 may also operate off of user inputs 1722. The logic simulator may be the LSIM logic simulator produced by LSI Logic Corp., with modifications as described below.

Modifications to the current LSIM (or similar) logic simulator will also be understood by those of ordinary skill in the art to which the present invention most nearly pertains, and should include:

1. Changes to the LSIM simulator's user interface such that it will accept its commands and parameters from the editor program (1710 with respect to FIG. 2) rather than from direct user input.

2. Changes to the LSIM simulator's function such that it will return status about stopping conditions to the schematic editor upon completion of its simulation.

3. Changes to the simulation output such that results will be provided in a data structure (1730 with respect to FIG. 2) rather than to a graphical device.

Again, with respect to FIG. 17, a logic verifier, 1726, performs design-rule checking of the schematic diagram captured by schematic editor 1710 by checking the components and their interconnections contained in the schematic object file 1720 against component interconnection and loading rules stored in component database 1712.

Finally, a layout program, 1728 with respect to FIG. 17, places components and routes their interconnections on a semiconductor chip. After completion of the layout, the schematic source file(s) 1704, schematic net-list 1714, and schematic object file(s) 1720 are updated with information about placement location, placement orientation, and placement induced electrical characteristics.

FIG. 18 shows a representative editor display 1800, namely a display of the screen of graphical display device 1606 of FIG. 16, with graphical schematic components 1802, 1804, 1806, and 1808 and their interconnections 1824, 1826, 1828, 1830, 1832, 1834, and 1836. In this particular display, the user has requested that textual state information be displayed. State display 1810 corresponds to and is adjacent to net 1824. State display 1812 corresponds to and is adjacent to net 1826. State display 1814 corresponds to and is adjacent to net 1832. State display 1816 corresponds to and is adjacent to net 1828.

FIG. 18 further shows the result of a state table having been built by simulation through the schematic editor. State table 1818 contains monitored node/net names 1820 and rows of simulation data (1822 is a representative sample) arranged in columnar format under the corresponding node/net names. State table 1818 is built by iterative invocations of the simulator by the schematic editor according to user specified monitoring and simulation conditions.

FIG. 19 shows a representative display screen image 1900, namely a display of the screen of graphical display device 1606 of FIG. 16, of the same circuit represented in FIG. 18 and under the same simulation conditions. Display screen image 1900, however represents the visual results if graphical timing diagram displays are requested by the user rather than textual state display. Timing diagrams 1910, 1912, 1914, 1916, 1918, and 1920 correspond to and are adjacent to nets 1824, 1826, 1832, 1828, 1836, and 1834, respectively. Each horizontal division in each timing diagram contains a graphical depiction of the state events which occurred during one stepped simulation cycle. All other features of FIG. 19 are identical to the same features in FIG. 18.

The present invention is of benefit to any computer aided design system where the simultaneous display of a schematic diagram of a circuit, or any similar representation thereof, and its simulation data is desired.

It will readily be appreciated by one of ordinary skill in the art that "schematic diagrams" can be representative of a great variety of electronic systems. For example, at the lowest level, a schematic diagram can represent a transistor-level circuit diagram of an integrated circuit. Another schematic diagram can represent a system of interconnected core functions in an integrated circuit. Yet another schematic diagram can represent a plurality of electronic components connected together as a system, such as a multi-chip module (i.e., a "flip-chip" system built from directly-connected integrated circuit dies) or a board-level system comprising a plurality of integrated circuits on a printed circuit board. All of these examples of schematic diagrams are representative of the wide variation of scale and hierarchy of electronic systems which can be represented by a schematic diagram.

It will readily be understood by one of ordinary skill in the art that an "electronic system" represented by a schematic diagram (and corresponding simulation models) on an ECAD system can be a transistor representation of a logic gate, a series of interconnected logic gates forming a portion of an integrated circuit design, a "core-cell" (e.g., a pre-designed high level function such as a microprocessor, memory, or peripheral controller to be incorporated into an integrated circuit design), all of the circuitry on an integrated circuit chip, a multi-chip module, a circuit board design using packaged electronic components, or a system including multiple circuit boards.

Most modern ECAD systems make use of "hierarchical designs" whereby high-level symbols can be used to represent detailed circuits contained on other (lower-level) schematics (schematic diagrams). Most of these ECAD systems provide for "looking down" into these symbols to display schematic diagrams for circuitry contained within these high-level symbols. For example, a high-level symbol may be used to represent a semi-custom integrated circuit in a schematic diagram. Lower-level schematic diagrams might include symbolic representations of one or more core-cells (e.g., microprocessor and/or memory core-cells) and other logic. Each of the core-cell symbols might, in turn, have associated lower-level schematic diagrams of circuitry making up the core cell. By traversing the schematic "hierarchy" during a simulation run, it is not only possible to view signals at the boundaries of a logic block (e.g., core cell), but to peer into the underlying logic behind the symbol and to view signals which are internal to the logic block.

In designing modern board-level systems or other complicated electronic systems (such as multi-chip modules) it is common to use such hierarchical design representations to minimize the level of complexity of any one schematic diagram. Such electronic system designs may include commercial off-the shelf logic components, custom and semi-custom integrated circuits (e.g., ASICs), etc. Simulation of such systems is accomplished by using simulation models of all of the components included in the design. For custom and semi-custom integrated circuit components, the simulation models are generally derived from the design database used to create the custom and semi-custom components. (In general, ASIC designs and other custom designs are accomplished on ECAD systems. A by-product of the design process is a simulation model for each component, either manually or automatically generated.)

Simulation models for the components of an electronic system may be behavioral models or full logic models. Often, a simulation models for a high-level commercial component (such as a microprocessor or a memory) describes the external behavior of the component, but does not provide sufficient internal description of the component to permit hierarchical "dissection" of the component as described above. In such cases, the lowest level of "visibility" for the component is the lowest level of hierarchy modeled in the simulation model. If, however, a full logic representation of a component is modeled, then lower hierarchical levels of the component can be simulated and viewed.

On occasion, it is necessary to simulate a system which includes electronic components for which no simulation model is available. It is well known in the art to provide "hardware simulators" which permit the users thereof to "plug in" physical electronic devices into a simulated system. Such hardware simulators convert software-generated representations of signals into electrical signals which are provided to a physical electronic device (e.g., an off-the-shelf microprocessor). The electronic device interacts with the "simulated" signals. The electrical responses of the electronic device are in turn converted into software representations of electronic signals and provided to the simulated components. In similar fashion, a single simulated software component can be "plugged into" a physical electronic system. For example, a new microprocessor system can be tested with a simulation of a new microprocessor chip before the microprocessor chip itself is available. Mixed hardware and software simulations of this type are capable of accommodating nearly any arbitrary combination of simulated and physical components.

Such mixed hardware and software simulations can include mixed-level software simulations. That is, the software portion of the simulation can include behavioral-level simulations, functional-level simulations, circuit-level simulations, logic-level simulations, etc. The technique is not dependent upon any particular "level" or "scale" of simulation, or upon any particular "level" or "scale" of electronic system. It should be noted, however, that the viewability of simulation results for a "hardware simulation" is generally restricted the signals at the points of connection of the physical device or system to the "hardware simulator".

Having now discussed various types of electronic systems and simulations thereof, attention is directed to some examples of the various types of electronic systems.

An example of a multi-chip module system is shown in FIGS. 20a and 20b. FIG. 20a is a view of a representative multi-chip module 2000. The module 200 is made up of a "host" chip 2010, onto which "flip-chips" 2012, 2014, and 2016 are mounted. (Flip-chip mountings generally involve face-to-face interconnections between integrated circuit dies by means of conductive solder bumps joined in a reflow process.)

FIG. 20b shows the design hierarchy for the multi-chip module for FIG. 20a. A top-level design description 2000a represents the overall design of the multi-chip module 2000, and references design descriptions 2010a, 2012a, 2014a, and 2016a of the host-chip 2010 and the three "flip-chips" 2012, 2014, and 2016, respectively. A first of the flip-chip design descriptions 2016a references two core cells 2020 (core "A") and 2022 (core "B"), and additional random logic 2024 (misc. logic "A"). The design description 2010a for the host chip 2010 includes random logic 2026 (misc. logic "B"). A second of the flip-chip design descriptions 2012a, refers to one core cell 2028 (core "C") and additional random logic 2030 (misc. logic "C"). The remaining flip-chip design description 2014a is strictly behavioral and does not refer to any lower level functions.

FIGS. 21a and 21b are representative of a board-level system design. FIG. 21a is a view of a board level system 2100 built on a printed circuit board 2105. A microprocessor 2116 (CHIP 1), two controller chips 2110 and 2114 (CHIP 2 and CHIP 3, respectively) and nine memory chips 2112 (CHIP 4) are included in the design.

FIG. 21b shows the design hierarchy for the board level system of FIG. 21a. The board-level system design description 2100a makes reference to design descriptions 2116a, 2110a, 2114a, and 2112a for the microprocessor 2116 (CHIP 1), the two controllers 2110 and 2114 (CHIP2 and CHIP 3, respectively) and the memory chips 2112 (CHIP 4). The microprocessor 2116 is a custom design which includes two core cells and additional logic. This is indicated in the hierarchy by the design description 2116a for the microprocessor 2116, which refers to two core cells 2120 (CORE "A") and 2122 (CORE "B"), and a logic block 2124 (misc. logic "A"). The design description 2110a for one of the controllers 2110 (CHIP 2) refers to a logic block 2126 (misc. logic "B"). The design description 2114a for the other controller 2114 (CHIP 3) refers to a core cell 2128 (CORE "C") and a logic block 2130 (misc. logic "C"). The design description 2114a for the memory chips 2114 (CHIP 4) treats the memory as a storage function block, and provides no visibility into circuitry inside of the memory.

By applying the graphical interactive schematic simulation techniques described hereinabove with respect to FIGS. 16–19 to the board level system 2100 of FIG. 21a, a screen display such as that shown in FIG. 22 results.

In FIG. 22, graphical representations 2216, 2214, 2210, and 2212, corresponding to the microprocessor 2116, controller 2114 (CHIP 3), controller 2110 (CHIP 2) and memories 2112 (CHIP 4), respectively, of FIGS. 21a–b, are shown on an ECAD display screen 2200 in schematic diagram form. A bus signal line 2220 (CTRL<0 . . . 3>, representing four physical "wires") connects between the graphical representation 2216 of the microprocessor 2116 and the graphical representation 2214 of the controller 2114 and extends off towards the right hand side of the display screen 2200 (as depicted). An underlying simulation of the system represented on the screen 2200 (such simulations are described hereinabove) produces simulation results. A subset of the simulation results corresponding to signals on the bus 2220 are displayed on the screen 2200 in the form of a graphical timing diagram display 2220a positioned adjacent to the bus 2220 on the display screen 2200. Another subset of the simulation results corresponding to a signal on a READY line 2230 is displayed as a graphical timing diagram display 2230a, adjacent to the READY line 2230 on the display screen.

It will readily be appreciated by one of ordinary skill in the art that any of the display techniques described hereinabove with respect to FIGS. 16–19 can be applied to the system of FIG. 21a. Any signal line on a display screen schematic representation (e.g. 2200) of all or a portion of an electronic system can have either textual or graphical simulation "notations" placed beside signal lines on the display screen. Further, the design "hierarchy" may be used to traverse various "levels" of the system to provide schematic diagrams and simulation data for signals "inside" or "behind" high-level symbols. Such "viewability" of schematic diagrams and simulation results is therefore available down to the lowest modelled level of the electronic system.

The simultaneous schematic diagram and simulation display technique described hereinabove with respect to FIGS. 16–19 and 22, can be applied to any electronic system, including board level systems, integrated circuits, multi-board systems, multi-chip modules, or any portion of an electronic system. The simulation results can include results obtained from a "hardware" simulation whereby one or more physical components are "plugged into" a software simulation.

Effectively, then, any electronic system or portion thereof at any hierarchical level, which can be represented by a schematic diagram and which can be simulated, either by software or mixed software/hardware means, can be presented in the fashion shown and described with respect to FIGS. 16–19 and 22. That is, if a system can be displayed on a display screen in schematic form and the system can be simulated, then the simulation results can be collected and displayed along with the schematic representation on the display screen as textual signal values, timing diagrams, state tables, etc.

This method of displaying simulation results on a schematic diagram can also be applied to electronic systems design by the logic synthesis process described hereinabove with respect to FIGS. 1–15.

FIG. 23a shows a system 2300a wherein a design description 2302 is operated upon by a VHDL logic synthesis process 2304, such as described hereinabove, to provide a completed electronic system design 2306. In the process, the logic synthesis process 2304 "fleshes out" the design description 2302 with intermediate design descriptions for lower levels of the design. A schematic display system 2310, such as that described hereinabove with respect to FIGS. 16–19 and 22, provides the capability of displaying simulation data on a schematic diagram on a user display 2312, in close association with graphical representations of the signal lines represented by the simulation data.

In the process of synthesizing digital logic, it is not uncommon to discover that one or more design rules (e.g., timing rules, loading rules, etc.) have been violated. The logic synthesis process 2304 provides indications an information about design rule violations 2308. This information includes data about what signals and components of the design are in violation of the rules. In response, the schematic display system calls up an appropriate schematic diagram (i.e., a schematic diagram on which the offending signal, signals, and/or components can be found) and displays the schematic diagram and simulation results corresponding to the design rule violations 2308. The user can then interact with the schematic display system (via the schematic editor) to make alterations to the design description 2302 which will eliminate or correct the design rule violations 2308.

The system described above with respect to FIG. 23a can be significantly enhance by the addition of an "expert system", or "knowledge-based system". Expert systems are widely known in the art, and generally comprise an "inference engine" and a "knowledge base". The knowledge base contains information pertinent to the solution of a particular set of problems, and is derived from "training sessions" whereby a human expert "trains" a computer expert system by going through a wide variety of problems and solutions, and providing the computer (directly and indirectly) with rules and guidelines for solving the problem. The rules and guidelines constitute a knowledge base with which an inference engine can attempt to suggest solutions to a new problem according to the training by the expert. Such a knowledge-based system is described in U.S. Pat. No. 4,965,741 issued Oct. 23, 1990 to Winchell et al., incorporated by reference herein. Such an expert system, "trained" in logic design techniques, can be used to augment the system of FIG. 23a by providing design assistance to the user in the form of suggestions for altering the design to correct the design rule violations.

FIG. 23b is a block diagram of an improved design system 2300b, similar to that of FIG. 23a, but including an inference engine 2314 and a knowledge base 2316. The inference engine 2314 and the knowledge base 2316 comprise an expert system. The knowledge base is trained with logic design techniques, design rules and methods for correcting design rule violations 2308. When design rule violations 2308 are indicated by the logic synthesis process 2304, the inference engine 2314 analyzes information about the design rule violations 2308 according to information contained in the knowledge base 2316, and suggests design alterations to the user, via the user display 2312 and schematic display system 2310. If the user accepts the suggested alterations, then the inference engine makes the corrections to the design description 2302.

What is claimed is:

1. In an ECAD system, a method of creating and validating a structural description of an electronic system from a higher level, behavior-oriented description thereof, comprising:

entering on an ECAD system a specification for a design of desired behavior of an electronic system, including timing goals, in a high-level, behavior-oriented language;

simulating and changing the design of the electronic system at the behavioral level until the desired behavior is obtained;

displaying the design of at least a portion of the electronic system as a plurality of graphical objects forming a schematic diagram and simultaneously displaying simulation data on the schematic diagram adjacent to graphical objects to which the simulation data applies;

partitioning the design of the device into a number of architectural blocks and constraining the architectural choices to those which meet the timing goals; and directing the various architectural blocks to logic synthesis programs, said logic synthesis programs also running in the ECAD system, thereby providing a netlist or gate-level description of the design.

2. A method according to claim 1, wherein:

architectural blocks having highly regular structures or well understood functions are directed to specific logic synthesis programs running on the ECAD system (e.g. memory or function compilers); and architectural blocks with random or unstructured logic are directed to more general logic synthesis programs running on the ECAD system.

3. A method according to claim 1, further comprising:

on the ECAD system, simulating the gate-level design description; and on the ECAD system, comparing the results of the gate-level simulation with those from the behavioral simulation to ensure that the gate-level design description behaves as intended and that the timing goals are achieved.

4. A method according to claim 3, further comprising:
on the ECAD system, back-annotating the design to ensure that other physical design limitations, such as capacitive loads, are not exceeded.

5. A method according to claim 3, further comprising:
inputting to the ECAD system the net list or gate-level description of the design to a layout tool running on the ECAD system for creating a physical implementation of the design.

6. A method according to claim 1, wherein:
the high-level behavioral description of the device is set forth in VHDL.

7. A method according to claim 1, further comprising:
interpreting the behavioral description of the device by attaching one or more semantic rules to each of the syntactic rules underlying the behavioral description, in the ECAD system.

8. A method according to claim 1, further comprising:
identifying, in the description of the electronic system, violations of pre-determined design rules;
providing indications of the design rule violations and information about the nature of the violations and the conditions under which they occur; and
displaying schematic objects and simulations results corresponding to the design rule violations on a schematic representation of at least a portion of the design.

9. A method according to claim 8, further comprising:
providing an expert system;
providing the indications of and information about the design rule violations to the expert system;
forming, by means of the expert system, suggestions for alterations to the design which correct or eliminate the design rule violation; and
displaying the suggested design alterations.

10. In an ECAD system, a method of creating and validating a structural description of an electronic system from a behavior-oriented description, comprising:
specifying a behavioral description for a design of desired behavior of an electronic system in a high-level, behavior-oriented language, and inputting the behavioral description to an ECAD system;
iteratively simulating and changing the behavioral description until the desired behavior is obtained;
partitioning the behavioral description into architectural blocks;
analyzing the specification for syntactic and semantic correctness;
forming a parse tree from the specification. wherein each node of the parse tree is associated with semantic rules; and
constructing hierarchical knowledge bases from the semantic rules, wherein the semantic rules are used to construct a knowledge base for each block of the specification and to derive hierarchical relationships among the knowledge bases, and the hierarchical knowledge bases comprise a structural description of the specification.

11. A method according to claim 10, wherein:
the electronic system is a design entity; and
the design entity is an entire system, a sub-system, a board, a chip, a macro-cell, a logic gate, or any level of abstraction in between.

12. A method according to claim 10, further comprising:
identifying, in the description of the electronic system, violations of pre-determined design rules;
providing indications of the design rule violations and information about the nature of the violations and the conditions under which they occur; and
displaying schematic objects and simulations results corresponding to the design rule violations on a schematic representation of at least a portion of the design.

13. A method according to claim 12, further comprising:
providing an expert system;
providing the indications of and information about the design rule violations to the expert system;
forming, by means of the expert system, suggestions for alterations to the design which correct or eliminate the design rule violation; and
displaying the suggested design alterations.

14. An ECAD system for creating and validating a structural description of an electronic system from a higher level, behavior-oriented description thereof, comprising:
means for entering on an ECAD system a specification for a design of desired behavior of an electronic system, including timing goals, in a high-level, behavior-oriented language;
means for simulating and changing the design of the electronic system at the behavioral level until the desired behavior is obtained;
means for displaying the design of at least a portion of the electronic system as a plurality of graphical objects forming a schematic diagram and simultaneously displaying simulation data on the schematic diagram adjacent to graphical objects to which the simulation data applies;
means for partitioning the design of the device into a number of architectural blocks and constraining the architectural choices to those which meet the timing goals; and
means for directing the various architectural blocks to logic synthesis programs, said logic synthesis programs also running in the ECAD system, thereby providing a netlist or gate-level description of the design.

15. An ECAD system according to claim 14, wherein:
the electronic circuit diagram represents at least a portion of the electronic system; and
the simulation data represents signals corresponding to the portion of the electronic system represented by the electronic circuit diagram.

16. An ECAD system according to claim 14, wherein
the means for simultaneously displaying an electronic circuit diagram and simulation data further comprises:
a computer processor, including means for storing graphical objects;
graphical display means, connected to said computer processor, for displaying the graphical objects;
a portion of said graphical objects being pre-defined graphical objects accessible to said computer processor, each representing a particular schematic symbol, and each having a plurality of input and/or output nodes to which input and/or output signals may be associated;
means for graphically indicating interconnections (nets) between said input and output nodes of said graphical object on said graphical display means;
means for enabling a problem solving user to manipulate or arrange said pre-defined graphical objects on said graphical display means in the form of a schematic diagram, such that said schematic diagram may be viewed on said graphic display means either in whole or in part; and means for enabling the problem solving user to create, delete or modify said graphical indications of interconnections between said graphical objects;

wherein:

the computer processor further includes:

a plurality of executable simulation models;

means for representing the state of interconnections between said graphical objects in the form of a net-list;

means for representing the state of interconnections between said graphical objects in the form of signal paths between simulation models;

means for specifying a signal state on any input or output node of said graphical objects;

means for specifying a signal state on any of said graphical interconnections (nets) between said input and output nodes of said graphical objects whereby said signal state is simultaneously applied to all input and output nodes connected thereto;

means for specifying an identified portion of said schematic diagram to be simulated;

means for specifying a simulation duration in the form a starting condition, or for specifying starting conditions and a stopping condition, or for specifying stopping conditions;

means for executing a simulation of the identified portion of said schematic diagram according to said starting and stopping conditions; and means for displaying, on said schematic diagram on said graphical display means, the end states of said simulation such that the state data corresponding to the output nodes of each of said graphical objects is displayed adjacent thereto and for displaying on said graphical display means real-time timing information and net values, and for displaying on said graphical display means the input, output and results of the simulation.

17. An ECAD system according to claim 16, wherein:

the executable simulation models are provided to the computer processor as user-prepared simulation stimuli in the form of a data file or data list.

18. An ECAD system according to claim 17, further comprising:

means for displaying, on said graphical display means, simulation results in the form of a waveform diagram (timing diagram) such that the waveform pertaining to each of the output nodes of each of said graphical objects is displayed adjacent thereto.

19. An ECAD system according to claim 18, further comprising:

means for grouping said waveform displays into a single composite timing diagram in a single area on said schematic diagram, and for displaying said composite timing diagram on said graphical display means.

20. An ECAD system according to claim 16, further comprising:

means for enabling the problem solving user to specify a group of nodes or nets whose simulation results are to be collected in tabular form on said schematic diagram such that a state table is formed as the simulation(s) is(are) run.

21. An ECAD system according to claim 16, further comprising:

means for displaying, on said graphical display means, state performance loading drive strengths and other useful data on selected object nodes of each object.

22. An ECAD system according to claim 16, further comprising:

means for enabling the problem solving user to move through the interactive simulation in defined steps, or increments of the lowest system granularity.

23. An ECAD system according to claim 16, further comprising:

means for enabling the problem solving user to move through the interactive simulation in defined steps related to clock cycles.

* * * * *